(12) United States Patent
Wood et al.

(10) Patent No.: US 9,424,930 B2
(45) Date of Patent: Aug. 23, 2016

(54) APPARATUS, SYSTEM, AND METHOD FOR NON-VOLATILE STORAGE ELEMENT PROGRAMMING

(75) Inventors: Robert Barry Wood, Niwot, CO (US); Jea Woong Hyun, South Jordan, UT (US); Hairong Sun, Superior, CO (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 509 days.

(21) Appl. No.: 13/234,137

(22) Filed: Sep. 15, 2011

(65) Prior Publication Data

US 2012/0063231 A1    Mar. 15, 2012

Related U.S. Application Data

(60) Provisional application No. 61/383,327, filed on Sep. 15, 2010.

(51) Int. Cl.
*G11C 16/10* (2006.01)
*G11C 11/56* (2006.01)

(52) U.S. Cl.
CPC ............ *G11C 16/10* (2013.01); *G11C 11/5628* (2013.01)

(58) Field of Classification Search
CPC .......................... G11C 16/10; G11C 11/5628
USPC ............. 365/185.03, 185.11, 185.12, 185.17, 365/185.18, 185.23, 185.24; 711/103
See application file for complete search history.

(56) References Cited

U.S. PATENT DOCUMENTS

| | | | | |
|---|---|---|---|---|
| 5,844,841 | A * | 12/1998 | Takeuchi et al. | ......... 365/185.03 |
| 6,278,633 | B1 | 8/2001 | Wong et al. | |
| 6,331,946 | B1 * | 12/2001 | Silverbrook et al. | .... 365/185.04 |
| 6,816,407 | B2 * | 11/2004 | Rolandi | ................... 365/185.03 |
| 2003/0053334 | A1 * | 3/2003 | Chen | ...................... G11C 11/56 365/185.03 |
| 2009/0080247 | A1 * | 3/2009 | Lasser | ................ G11C 11/5628 365/185.03 |
| 2010/0008140 | A1 * | 1/2010 | Lee | .................... G11C 11/5621 365/185.03 |
| 2010/0074016 | A1 | 3/2010 | Higashitani | |
| 2010/0157675 | A1 | 6/2010 | Shalvi et al. | |
| 2011/0225383 | A1 * | 9/2011 | Rankl | ........................... 711/163 |

OTHER PUBLICATIONS

Kim et al.; Low Stress Program and Single Wordline Erase Schemes for NAND Flash Memory; IEEE; 2007; pp. 19-20.
Lee et al.; A 32Gb MLC NAND-Flash Memory with Vth-Endurance-Enhancing Schemes in 32nm CMOS; 2010 IEEE International Solid-State Circuits Conference; Feb. 2010; pp. 446-448.
Lee et al.; A New Programming Disturbance Phenomenon in NAND Flash Memory by Source/Drain Hot-Electrons Generated by GIDL Current; IEEE; 2006; 3 pp.

* cited by examiner

*Primary Examiner* — John H. Hur
(74) *Attorney, Agent, or Firm* — Kunzler Law Group, PC

(57) ABSTRACT

Methods, storage controllers, and systems for non-volatile storage element programming are described. One method includes programming user data in pages associated with a set of wordlines of an erase block of a non-volatile, solid-state storage element. The method further includes selecting at least one of the wordlines of the set programmed with the user data and restricting further programming of user data in the pages associated with the selected wordline. In some embodiments, the selected wordline occurs subsequent to the pages associated with the other wordlines of the set in a page programming order for the erase block.

23 Claims, 14 Drawing Sheets

APPARATUS, SYSTEM, AND METHOD FOR NON-VOLATILE STORAGE ELEMENT PROGRAMMING

CROSS-REFERENCES TO RELATED APPLICATIONS

This application claims priority to U.S. Provisional Patent Application Ser. No. 61/383,327, entitled "Apparatus, System, and Method for Improved Data Reliability and Data Retention in Non-Volatile Storage Media" which was filed on Sep. 15, 2010 and which is incorporated herein by reference.

BACKGROUND OF THE INVENTION

1. Field of the Invention

This invention relates to data storage devices and more particularly relates to non-volatile storage element programming.

2. Description of the Related Art

Some solid-state storage elements, such as NAND flash, are organized into erase blocks and pages. The pages may be programmed and read using wordlines and bitlines associated with the erase blocks. Some pages of an erase block may be more susceptible to bit errors than others. In some cases, the pages associated with a particular wordline of an erase block may be more susceptible to bit errors due to their position in the erase block than pages associated with other word lines of an erase block. In other cases, the pages associated with a particular wordline of an erase block may be more susceptible to bit errors due to the order in which pages for a certain wordline are programmed in relation to other word lines of an erase block. In particular, the bit errors may result from one wordline having a lower retention time than others within the same erase block.

Such bit errors may be detected and corrected with a suitable error correcting code. To ensure data integrity, an error correcting code must be selected that is robust enough to protect the susceptible pages from bit errors. However, using such an error correcting code may be wasteful, especially for pages that are less susceptible to bit errors, since the error correcting code consumes space in the erase block that could be used to store data.

SUMMARY OF THE INVENTION

Embodiments of a method are described. In one embodiment, a method includes programming user data in pages associated with a set of wordlines of an erase block of a non-volatile, solid-state storage element. The method further includes selecting at least one of the wordlines of the set programmed with the user data and restricting further programming of user data in the pages associated with the selected wordline. Other embodiments of the method are also described.

Embodiments of a storage controller are described. In one embodiment, a storage controller includes a write data pipeline and a word line restriction module. The write data pipeline programs user data in pages associated with a set of wordlines of an erase block of a non-volatile, solid-state storage element. The wordline restriction module selects at least one of the wordlines of the set programmed with the user data and restricts subsequent programming of user data in the pages associated with the selected wordline. Other storage controller embodiments are also described.

Embodiments of a system are described. In one embodiment, a system includes a non-volatile, solid-state storage element and a storage controller. The storage controller programs user data in pages associated with a set of wordlines of an erase block of the non-volatile, solid-state storage element. The storage controller also selects at least one of the wordlines of the set programmed with the user data and restricts further programming of user data in the pages associated with the selected wordline. Other systems embodiments are also described.

Other aspects and advantages of embodiments of the present invention will become apparent from the following detailed description, taken in conjunction with the accompanying drawings, illustrated by way of example of the principles of the invention.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Figure 1:
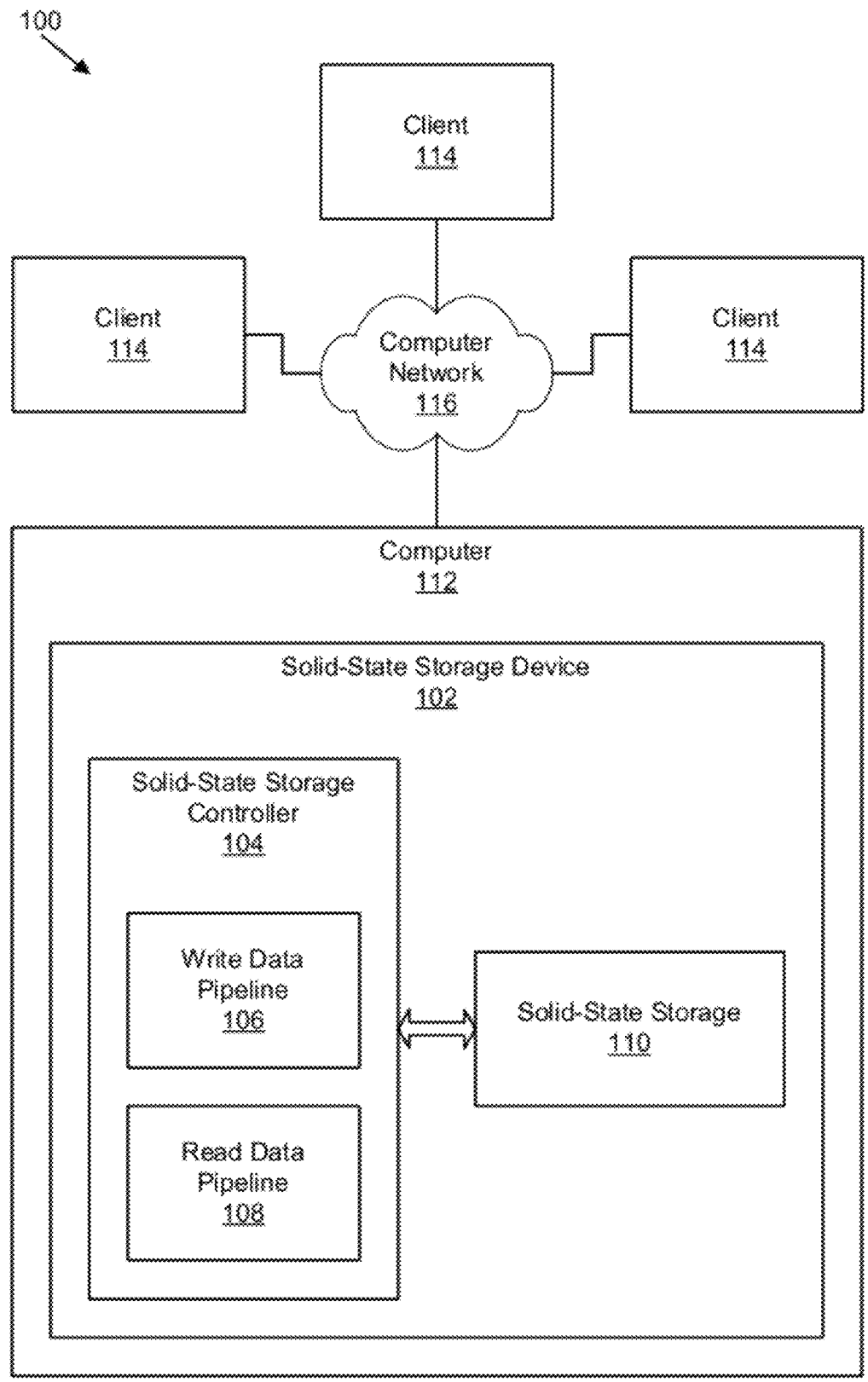
FIG. 1 is a schematic block diagram illustrating one embodiment of a system for improved data reliability and data retention in non-volatile storage media in accordance with the present invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of computer readable program code may, for instance, comprise one or more physical or logical blocks of computer instructions, which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of computer readable program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the computer readable program code may be stored and/or propagated on or in one or more computer readable medium(s).

The computer readable medium may be a tangible computer readable storage medium storing the computer readable program code. The computer readable storage medium may be, for example, but not limited to, an electronic, magnetic, optical, electromagnetic, infrared, holographic, micromechanical, or semiconductor system, apparatus, or device, or any suitable combination of the foregoing.

More specific examples of the computer readable medium may include but are not limited to a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), an optical storage device, a magnetic storage device, a holographic storage medium, a micromechanical storage device, or any suitable combination of the foregoing. In the context of this document, a computer readable storage medium may be any tangible medium that can contain, and/or store computer readable program code for use by and/or in connection with an instruction execution system, apparatus, or device.

The computer readable medium may also be a computer readable signal medium. A computer readable signal medium may include a propagated data signal with computer readable program code embodied therein, for example, in baseband or as part of a carrier wave. Such a propagated signal may take any of a variety of forms, including, but not limited to, electrical, electro-magnetic, magnetic, optical, or any suitable combination thereof. A computer readable signal medium may be any computer readable medium that is not a computer readable storage medium and that can communicate, propagate, or transport computer readable program code for use by or in connection with an instruction execution system, apparatus, or device. Computer readable program code embodied on a computer readable signal medium may be transmitted using any appropriate medium, including but not limited to wireless, wireline, optical fiber cable, Radio Frequency (RF), or the like, or any suitable combination of the foregoing. In one embodiment, the computer readable medium may comprise a combination of one or more computer readable storage mediums and one or more computer readable signal mediums. For example, computer readable program code may be both propagated as an electro-magnetic signal through a fiber optic cable for execution by a processor and stored on RAM storage device for execution by the processor.

Computer readable program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The computer readable program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and computer program products according to embodiments of the invention. It will be understood that each block of the schematic flowchart diagrams and/or schematic block diagrams, and combinations of blocks in the schematic flowchart diagrams and/or schematic block diagrams, can be implemented by computer readable program code. These computer readable program code may be provided to a processor of a general purpose computer, special purpose computer, sequencer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The computer readable program code may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

The computer readable program code may also be loaded onto a computer, other programmable data processing apparatus, or other devices to cause a series of operational steps to be performed on the computer, other programmable apparatus or other devices to produce a computer implemented process such that the program code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and computer readable program code.

Solid-State Storage System

FIG. 1 is a schematic block diagram illustrating one embodiment of a system 100 for improving performance in a solid-state storage device in accordance with the present invention. The system 100 includes a solid-state storage device 102, a solid-state storage controller 104, a write data pipeline 106, a read data pipeline 108, a solid-state storage media 110, a computer 112, a client 114, and a computer network 116, which are described below.

The system 100 includes at least one solid-state storage device 102. In another embodiment, the system 100 includes two or more solid-state storage devices 102. Each solid-state storage device 102 may include non-volatile, solid-state storage media 110, such as flash memory, nano random access memory ("nano RAM or NRAM"), nanocrystal wire-based memory, silicon-oxide based sub-10 nanometer process memory, graphene memory, Silicon-Oxide-Nitride-Oxide-Silicon ("SONOS"), Resistive random-access memory ("RRAM"), programmable metallization cell ("PMC"), conductive-bridging RAM ("CBRAM"), magneto-resistive RAM ("MRAM"), dynamic RAM ("DRAM"), phase change RAM ("PRAM"), etc. The solid-state storage device 102 is described in more detail with respect to FIGS. 2 and 3. The solid-state storage device 102 is depicted in a computer 112 connected to a client 114 through a computer network 116. In one embodiment, the solid-state storage device 102 is internal to the computer 112 and is connected using a system bus, such as a peripheral component interconnect express ("PCI-e") bus, a Serial Advanced Technology Attachment ("serial ATA") bus, or the like. In another embodiment, the solid-state storage device 102 is external to the computer 112 and is connected, a universal serial bus ("USB") connection, an Institute of Electrical and Electronics Engineers ("IEEE") 1394 bus ("FireWire"), or the like. In other embodiments, the solid-state storage device 102 is connected to the computer 112 using a peripheral component interconnect ("PCI") express bus using external electrical or optical bus extension or bus networking solution such as Infiniband or PCI Express Advanced Switching ("PCIe-AS"), or the like.

In various embodiments, the solid-state storage device 102 may be in the form of a dual-inline memory module ("DIMM"), a daughter card, or a micro-module. In another embodiment, the solid-state storage device 102 is an element within a rack-mounted blade. In another embodiment, the solid-state storage device 102 is contained within a package that is integrated directly onto a higher level assembly (e.g. mother board, lap top, graphics processor). In another embodiment, individual components comprising the solid-state storage device 102 are integrated directly onto a higher level assembly without intermediate packaging.

The solid-state storage device 102 includes one or more solid-state storage controllers 104, each may include a write data pipeline 106 and a read data pipeline 108 and each includes a solid-state storage media 110, which are described in more detail below with respect to FIGS. 2 and 3.

The system 100 includes one or more computers 112 connected to the solid-state storage device 102. A computer 112 may be a host, a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. In another embodiment, a computer 112 may be a client and the solid-state storage device 102 operates autonomously to service data requests sent from the computer 112. In this embodiment, the computer 112 and solid-state storage device 102 may be connected using a computer network, system bus, or other communication means suitable for connection between a computer 112 and an autonomous solid-state storage device 102.

In one embodiment, the system 100 includes one or more clients 114 connected to one or more computer 112 through one or more computer networks 116. A client 114 may be a host, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. In another embodiment, the client 114 operates within the computer 112. The client 114 may be an application, a server, an applet, a thread, a driver, a database management system, a daemon, or the like. The computer network 116 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The computer network 116 may also include a network from the IEEE 802 family of network technologies, such Ethernet, token ring, WiFi, WiMax, and the like.

The computer network 116 may include servers, switches, routers, cabling, radios, and other equipment used to facilitate networking computers 112 and clients 114. In one embodiment, the system 100 includes multiple computers 112 that communicate as peers over a computer network 116. In another embodiment, the system 100 includes multiple solid-state storage devices 102 that communicate as peers over a computer network 116. One of skill in the art will recognize other computer networks 116 comprising one or more computer networks 116 and related equipment with single or redundant connection between one or more clients 114 or other computer with one or more solid-state storage devices 102 or one or more solid-state storage devices 102 connected to one or more computers 112. In one embodiment, the system 100 includes two or more solid-state storage devices 102 connected through the computer network 116 to a client 114 without a computer 112.

Solid-State Storage Device

Figure 2:
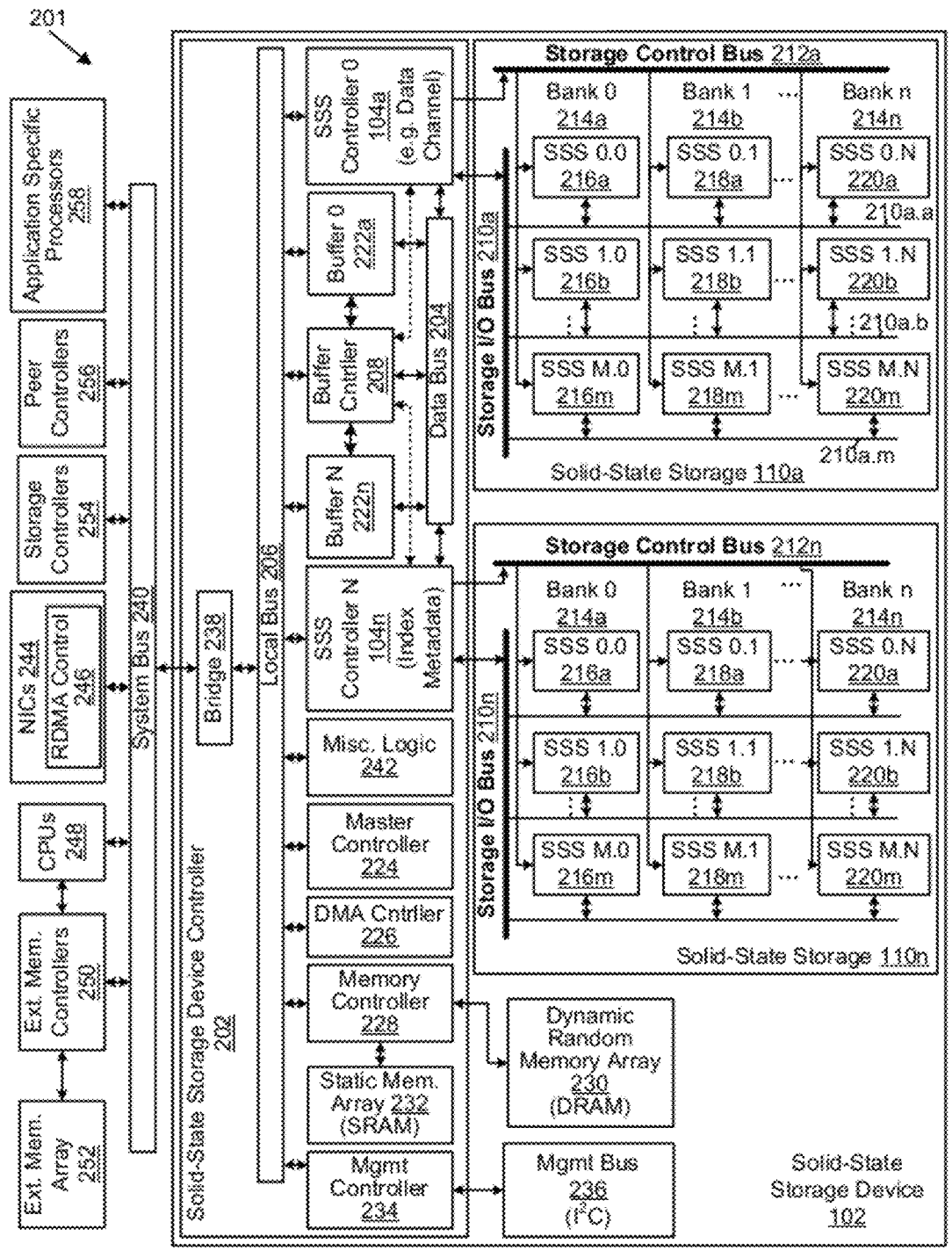
FIG. 2 is a schematic block diagram illustrating one embodiment of a solid-state storage device controller for improved data reliability and data retention in non-volatile storage media in accordance with the present invention.

FIG. 2 is a schematic block diagram illustrating one embodiment 200 of a solid-state storage device controller 202 that includes a write data pipeline 106 and a read data pipeline 108 in a solid-state storage device 102 in accordance with the present invention. The solid-state storage device controller 202 may be embodied as hardware, as software, or as a combination of hardware and software. The solid-state storage device controller 202 may include a number of solid-state storage controllers 0-N 104*a*-*n*, each controlling solid-state storage media 110.

In the depicted embodiment, two solid-state controllers are shown: solid-state controller 0 104*a* and solid-state storage controller N 104*n*, and each controls solid-state storage media 110*a*-*n*. In the depicted embodiment, solid-state storage controller 0 104*a* controls a data channel so that the attached solid-state storage media 110*a* stores data. Solid-state storage controller N 104*n* controls an index metadata channel associated with the stored data and the associated solid-state storage media 110*n* stores index metadata. In an alternate embodiment, the solid-state storage device controller 202 includes a single solid-state controller 104*a* with a single solid-state storage media 110*a*. In another embodiment, there are a plurality of solid-state storage controllers 104*a*-*n* and associated solid-state storage media 110*a*-*n*. In one embodiment, one or more solid-state controllers 104*a*-104*n*−1, coupled to their associated solid-state storage media 110*a*-110*n*−1, control data while at least one solid-state storage controller 104*n*, coupled to its associated solid-state storage media 110*n*, controls index metadata.

In one embodiment, at least one solid-state controller 104 is field-programmable gate array ("FPGA") and controller functions are programmed into the FPGA. In a particular embodiment, the FPGA is a Xilinx® FPGA. In another embodiment, the solid-state storage controller 104 comprises components specifically designed as a solid-state storage controller 104, such as an application-specific integrated circuit ("ASIC") or custom logic solution. Each solid-state storage controller 104 typically includes a write data pipeline 106 and a read data pipeline 108, which are describe further in relation to FIG. 3. In another embodiment, at least one solid-state storage controller 104 is made up of a combination FPGA, ASIC, and custom logic components.

Solid-State Storage

The solid-state storage media 110 is an array of non-volatile solid-state storage elements 216, 218, 220, arranged in banks 214, and accessed in parallel through a bi-directional storage input/output ("I/O") bus 210. The storage I/O bus 210, in one embodiment, is capable of unidirectional communication at any one time. For example, when data is being written to the solid-state storage media 110, data cannot be read from the solid-state storage media 110. In another embodiment, data can flow both directions simultaneously. However bi-directional, as used herein with respect to a data bus, refers to a data pathway that can have data flowing in only one direction at a time, but when data flowing one direction on the bi-directional data bus is stopped, data can flow in the opposite direction on the bi-directional data bus.

A solid-state storage element (e.g. SSS 0.0 216*a*) is typically configured as a chip (a package of one or more dies) or a die on a circuit board. As depicted, a solid-state storage element (e.g. 216*a*) operates independently or semi-independently of other solid-state storage elements (e.g. 218*a*) even if these several elements are packaged together in a chip package, a stack of chip packages, or some other package element. As depicted, a row of solid-state storage elements 216a, 216b, 216m is designated as a bank 214.

As depicted, there may be "n" banks 214a-n and "m" solid-state storage elements 216a-m, 218a-m, 220a-m per bank in an array of n×m solid-state storage elements 216, 218, 220 in a solid-state storage media 110. Of course different embodiments may include different values for n and m. In one embodiment, the solid-state storage media 110a includes twenty solid-state storage elements 216, 218, 220 per bank 214 with eight banks 214. In one embodiment, the solid-state storage media 110a includes twenty four solid-state storage elements 216, 218, 220 per bank 214 with eight banks 214. In addition to the n×m storage elements 216, 218, 220, one or more additional columns (P) may also be addressed and operated in parallel with other solid-state storage elements 216a, 216b, 216m for one or more rows. The added P columns in one embodiment, store parity data for the portions of an ECC chunk (i.e. an ECC codeword) that span m storage elements for a particular bank. In one embodiment, each solid-state storage element 216, 218, 220 is comprised of single-level cell ("SLC") devices. In another embodiment, each solid-state storage element 216, 218, 220 is comprised of multi-level cell ("MLC") devices.

In one embodiment, solid-state storage elements that share a common storage I/O bus 210a (e.g. 216b, 218b, 220b) are packaged together. In one embodiment, a solid-state storage element 216, 218, 220 may have one or more dies per chip with one or more chips stacked vertically and each die may be accessed independently. In another embodiment, a solid-state storage element (e.g. SSS 0.0 216a) may have one or more virtual dies per die and one or more dies per chip and one or more chips stacked vertically and each virtual die may be accessed independently. In another embodiment, a solid-state storage element SSS 0.0 216a may have one or more virtual dies per die and one or more dies per chip with some or all of the one or more dies stacked vertically and each virtual die may be accessed independently.

In one embodiment, two dies are stacked vertically with four stacks per group to form eight storage elements (e.g. SSS 0.0-SSS 8.0) 216a-220a, each in a separate bank 214a-n. In another embodiment, 24 storage elements (e.g. SSS 0.0-SSS 0.24) 216 form a logical bank 214a so that each of the eight logical banks has 24 storage elements (e.g. SSS 0.0-SSS 8.24) 216, 218, 220. Data is sent to the solid-state storage media 110 over the storage I/O bus 210 to all storage elements of a particular group of storage elements (SSS 0.0-SSS 8.0) 216a, 218a, 220a. The storage control bus 212a is used to select a particular bank (e.g. Bank 0 214a) so that the data received over the storage I/O bus 210 connected to all banks 214 is written just to the selected bank 214a.

In a one embodiment, the storage I/O bus 210 is comprised of one or more independent I/O buses ("IIOBa-m" comprising 210a.a-m, 210n.a-m) wherein the solid-state storage elements within each column share one of the independent I/O buses that accesses each solid-state storage element 216, 218, 220 in parallel so that all banks 214 are accessed simultaneously. For example, one channel of the storage I/O bus 210 may access a first solid-state storage element 216a, 218a, 220a of each bank 214a-n simultaneously. A second channel of the storage I/O bus 210 may access a second solid-state storage element 216b, 218b, 220b of each bank 214a-n simultaneously. Each row of solid-state storage element 216a, 216b, 216m is accessed simultaneously. In one embodiment, where solid-state storage elements 216, 218, 220 are multi-level (physically stacked), all physical levels of the solid-state storage elements 216, 218, 220 are accessed simultaneously. As used herein, "simultaneously" also includes near simultaneous access where devices are accessed at slightly different intervals to avoid switching noise. Simultaneously is used in this context to be distinguished from a sequential or serial access wherein commands and/or data are sent individually one after the other.

Typically, banks 214a-n are independently selected using the storage control bus 212. In one embodiment, a bank 214 is selected using a chip enable or chip select. Where both chip select and chip enable are available, the storage control bus 212 may select one level of a multi-level solid-state storage element 216, 218, 220. In other embodiments, other commands are used by the storage control bus 212 to individually select one level of a multi-level solid-state storage element 216, 218, 220. Solid-state storage elements 216, 218, 220 may also be selected through a combination of control and of address information transmitted on storage I/O bus 210 and the storage control bus 212.

In one embodiment, each solid-state storage element 216, 218, 220 is partitioned into erase blocks and each erase block is partitioned into pages. An erase block on a solid-state storage element 216, 218 220 may be called a physical erase block or "PEB." A typical page is 2000 bytes ("2 kB"). In one example, a solid-state storage element (e.g. SSS 0.0) includes two registers and can program two pages so that a two-register solid-state storage element 216, 218, 220 has a capacity of 4 kB. A bank 214 of 20 solid-state storage elements 216a, 216b, 216m would then have an 80 kB capacity of pages accessed with the same address going out the channels of the storage I/O bus 210.

This group of pages in a bank 214 of solid-state storage elements 216a, 216b, 216m of 80 kB may be called a logical page or virtual page. Similarly, an erase block of each storage element 216a-m of a bank 214a may be grouped to form a logical erase block or a virtual erase block. In one embodiment, an erase block of pages within a solid-state storage element 216, 218, 220 is erased when an erase command is received within a solid-state storage element 216, 218, 220. Whereas the size and number of erase blocks, pages, planes, or other logical and physical divisions within a solid-state storage element 216, 218, 220 are expected to change over time with advancements in technology, it is to be expected that many embodiments consistent with new configurations are possible and are consistent with the general description herein.

Typically, when a packet is written to a particular location within a solid-state storage element 216, 218, 220, wherein the packet is intended to be written to a location within a particular page which is specific to a particular physical erase block of a particular storage element of a particular bank, a physical address is sent on the storage I/O bus 210 and followed by the packet. The physical address contains enough information for the solid-state storage element 216, 218, 220 to direct the packet to the designated location within the page. Since all storage elements in a column of storage elements (e.g. SSS 0.0-SSS N.0 216a, 218a, 220a) are accessed simultaneously by the appropriate bus within the storage I/O bus 210a.a, to reach the proper page and to avoid writing the data packet to similarly addressed pages in the column of storage elements (SSS 0.0-SSS N.0 216a, 218a, 220a), the bank 214a that includes the solid-state storage element SSS 0.0 216a with the correct page where the data packet is to be written is simultaneously selected by the storage control bus 212.

Similarly, satisfying a read command on the storage I/O bus 210 requires a simultaneous signal on the storage control bus 212 to select a single bank 214a and the appropriate page within that bank 214a. In one embodiment, a read command reads an entire page, and because there are multiple solid-state storage elements 216a, 216b, 216m in parallel in a bank 214, an entire logical page is read with a read command. However, the read command may be broken into subcommands, as will be explained below with respect to bank interleave. A logical page may also be accessed in a write operation.

An erase block erase command may be sent out to erase an erase block over the storage I/O bus 210 with a particular erase block address to erase a particular erase block. Typically, an erase block erase command may be sent over the parallel paths of the storage I/O bus 210 to erase a logical erase block, each with a particular erase block address to erase a particular erase block. Simultaneously a particular bank (e.g. Bank 0 214a) is selected over the storage control bus 212 to prevent erasure of similarly addressed erase blocks in all of the banks (Banks 1-N 214b-n). Alternatively, no particular bank (e.g. Bank 0 214a) is selected over the storage control bus 212 to enable erasure of similarly addressed erase blocks in all of the banks (Banks 1-N 214b-n) simultaneously. Other commands may also be sent to a particular location using a combination of the storage I/O bus 210 and the storage control bus 212. One of skill in the art will recognize other ways to select a particular storage location using the bi-directional storage I/O bus 210 and the storage control bus 212.

In one embodiment, packets are written sequentially to the solid-state storage media 110. For example, packets are streamed to the storage write buffers of a bank 214a of storage elements 216 and when the buffers are full, the packets are programmed to a designated logical page. Packets then refill the storage write buffers and, when full, the packets are written to the next logical page. The next logical page may be in the same bank 214a or another bank (e.g. 214b). This process continues, logical page after logical page, typically until a logical erase block is filled. In another embodiment, the streaming may continue across logical erase block boundaries with the process continuing, logical erase block after logical erase block.

In a read, modify, write operation, data packets associated with requested data are located and read in a read operation. Data segments of the modified requested data that have been modified are not written to the location from which they are read. Instead, the modified data segments are again converted to data packets and then written sequentially to the next available location in the logical page currently being written. The index entries for the respective data packets are modified to point to the packets that contain the modified data segments. The entry or entries in the index for data packets associated with the same requested data that have not been modified will include pointers to original location of the unmodified data packets. Thus, if the original requested data is maintained, for example to maintain a previous version of the requested data, the original requested data will have pointers in the index to all data packets as originally written. The new requested data will have pointers in the index to some of the original data packets and pointers to the modified data packets in the logical page that is currently being written.

In a copy operation, the index includes an entry for the original requested data mapped to a number of packets stored in the solid-state storage media 110. When a copy is made, new copy of the requested data is created and a new entry is created in the index mapping the new copy of the requested data to the original packets. The new copy of the requested data is also written to the solid-state storage media 110 with its location mapped to the new entry in the index. The new copy of the requested data packets may be used to identify the packets within the original requested data that are referenced in case changes have been made in the original requested data that have not been propagated to the copy of the requested data and the index is lost or corrupted.

Beneficially, sequentially writing packets facilitates a more even use of the solid-state storage media 110 and allows the solid-storage device controller 202 to monitor storage hot spots and level usage of the various logical pages in the solid-state storage media 110. Sequentially writing packets also facilitates a powerful, efficient garbage collection system, which is described in detail below. One of skill in the art will recognize other benefits of sequential storage of data packets.

Solid-State Storage Device Controller

In various embodiments, the solid-state storage device controller 202 also includes a data bus 204, a local bus 206, a buffer controller 208, buffers 0-N 222a-n, a master controller 224, a direct memory access ("DMA") controller 226, a memory controller 228, a dynamic memory array 230, a static random memory array 232, a management controller 234, a management bus 236, a bridge 238 to a system bus 240, and miscellaneous logic 242, which are described below. In other embodiments, the system bus 240 is coupled to one or more network interface cards ("NICs") 244, some of which may include remote DMA ("RDMA") controllers 246, one or more central processing unit ("CPU") 248, one or more external memory controllers 250 and associated external memory arrays 252, one or more storage controllers 254, peer controllers 256, and application specific processors 258, which are described below. The components 244-258 connected to the system bus 240 may be located in the computer 112 or may be other devices.

Typically, the solid-state storage controller(s) 104 communicate data to the solid-state storage media 110 over a storage I/O bus 210. In a typical embodiment where the solid-state storage is arranged in banks 214 and each bank 214 includes multiple storage elements 216a, 216b, 216m accessed in parallel, the storage I/O bus 210 is an array of busses, one for each column of storage elements 216, 218, 220 spanning the banks 214. As used herein, the term "storage I/O bus" may refer to one storage I/O bus 210 or an array of data independent busses 204. In one embodiment, each storage I/O bus 210 accessing a column of storage elements (e.g. 216a, 218a, 220a) may include a logical-to-physical mapping for storage divisions (e.g. erase blocks) accessed in a column of storage elements 216a, 218a, 220a. This mapping (or bad block remapping) allows a logical address mapped to a physical address of a storage division to be remapped to a different storage division if the first storage division fails, partially fails, is inaccessible, or has some other problem.

Data may also be communicated to the solid-state storage controller(s) 104 from a requesting device 155 through the system bus 240, bridge 238, local bus 206, buffer(s) 222, and finally over a data bus 204. The data bus 204 typically is connected to one or more buffers 222a-n controlled with a buffer controller 208. The buffer controller 208 typically controls transfer of data from the local bus 206 to the buffers 222 and through the data bus 204 to the pipeline input buffer 306 and output buffer 330. The buffer controller 208 typically controls how data arriving from a requesting device can be temporarily stored in a buffer 222 and then transferred onto a data bus 204, or vice versa, to account for different clock domains, to prevent data collisions, etc. The buffer controller 208 typically works in conjunction with the master controller 224 to coordinate data flow. As data arrives, the data will arrive on the system bus 240, be transferred to the local bus 206 through a bridge 238.

Typically, the data is transferred from the local bus 206 to one or more data buffers 222 as directed by the master controller 224 and the buffer controller 208. The data then flows out of the buffer(s) 222 to the data bus 204, through a solid-state controller 104, and on to the solid-state storage media 110 such as NAND flash or other storage media. In one embodiment, data and associated out-of-band metadata ("metadata") arriving with the data is communicated using one or more data channels comprising one or more solid-state storage controllers 104a-104n-1 and associated solid-state storage media 110a-110n-1 while at least one channel (solid-state storage controller 104n, solid-state storage media 110n) is dedicated to in-band metadata, such as index information and other metadata generated internally to the solid-state storage device 102.

The local bus 206 is typically a bidirectional bus or set of busses that allows for communication of data and commands between devices internal to the solid-state storage device controller 202 and between devices internal to the solid-state storage device 102 and devices 244-258 connected to the system bus 240. The bridge 238 facilitates communication between the local bus 206 and system bus 240. One of skill in the art will recognize other embodiments such as ring structures or switched star configurations and functions of buses 240, 206, 204, 210 and bridges 238.

The system bus 240 is typically a bus of a computer 112 or other device in which the solid-state storage device 102 is installed or connected. In one embodiment, the system bus 240 may be a PCI-e bus, a Serial Advanced Technology Attachment ("serial ATA") bus, parallel ATA, or the like. In another embodiment, the system bus 240 is an external bus such as small computer system interface ("SCSI"), FireWire, Fiber Channel, USB, PCIe-AS, or the like. The solid-state storage device 102 may be packaged to fit internally to a device or as an externally connected device.

The solid-state storage device controller 202 includes a master controller 224 that controls higher-level functions within the solid-state storage device 102. The master controller 224, in various embodiments, controls data flow by interpreting object requests and other requests, directs creation of indexes to map object identifiers associated with data to physical locations of associated data, coordinating DMA requests, etc. Many of the functions described herein are controlled wholly or in part by the master controller 224.

In one embodiment, the master controller 224 uses embedded controller(s). In another embodiment, the master controller 224 uses local memory such as a dynamic memory array 230 (dynamic random access memory "DRAM"), a static memory array 232 (static random access memory "SRAM"), etc. In one embodiment, the local memory is controlled using the master controller 224. In another embodiment, the master controller 224 accesses the local memory via a memory controller 228. In another embodiment, the master controller 224 runs a Linux server and may support various common server interfaces, such as the World Wide Web, hyper-text markup language ("HTML"), etc. In another embodiment, the master controller 224 uses a nano-processor. The master controller 224 may be constructed using programmable or standard logic, or any combination of controller types listed above. One skilled in the art will recognize many embodiments for the master controller 224.

In one embodiment, where the storage device/solid-state storage device controller 202 manages multiple data storage devices/solid-state storage media 110a-n, the master controller 224 divides the work load among internal controllers, such as the solid-state storage controllers 104a-n. For example, the master controller 224 may divide an object to be written to the data storage devices (e.g. solid-state storage media 110a-n) so that a portion of the object is stored on each of the attached data storage devices. This feature is a performance enhancement allowing quicker storage and access to an object. In one embodiment, the master controller 224 is implemented using an FPGA. In another embodiment, the firmware within the master controller 224 may be updated through the management bus 236, the system bus 240 over a network connected to a NIC 244 or other device connected to the system bus 240.

In one embodiment, the master controller 224, which manages objects, emulates block storage such that a computer 112 or other device connected to the storage device/solid-state storage device 102 views the storage device/solid-state storage device 102 as a block storage device and sends data to specific physical addresses in the storage device/solid-state storage device 102. The master controller 224 then divides up the blocks and stores the data blocks as it would objects. The master controller 224 then maps the blocks and physical address sent with the block to the actual locations determined by the master controller 224. The mapping is stored in the object index. Typically, for block emulation, a block device application program interface ("API") is provided in a driver in the computer 112, client 114, or other device wishing to use the storage device/solid-state storage device 102 as a block storage device.

In another embodiment, the master controller 224 coordinates with NIC controllers 244 and embedded RDMA controllers 246 to deliver just-in-time RDMA transfers of data and command sets. NIC controller 244 may be hidden behind a non-transparent port to enable the use of custom drivers. Also, a driver on a client 114 may have access to the computer network 116 through an I/O memory driver using a standard stack API and operating in conjunction with NICs 244.

In one embodiment, the master controller 224 is also a redundant array of independent drive ("RAID") controller. Where the data storage device/solid-state storage device 102 is networked with one or more other data storage devices/solid-state storage devices 102, the master controller 224 may be a RAID controller for single tier RAID, multi-tier RAID, progressive RAID, etc. The master controller 224 also allows some objects to be stored in a RAID array and other objects to be stored without RAID. In another embodiment, the master controller 224 may be a distributed RAID controller element. In another embodiment, the master controller 224 may comprise many RAID, distributed RAID, and other functions as described elsewhere. In one embodiment, the master controller 224 controls storage of data in a RAID-like structure where parity information is stored in one or more storage elements 216, 218, 220 of a logical page where the parity information protects data stored in the other storage elements 216, 218, 220 of the same logical page.

In one embodiment, the master controller 224 coordinates with single or redundant network managers (e.g. switches) to establish routing, to balance bandwidth utilization, failover, etc. In another embodiment, the master controller 224 coordinates with integrated application specific logic (via local bus 206) and associated driver software. In another embodiment, the master controller 224 coordinates with attached application specific processors 258 or logic (via the external system bus 240) and associated driver software. In another embodiment, the master controller 224 coordinates with remote application specific logic (via the computer network 116) and associated driver software. In another embodiment, the master controller 224 coordinates with the local bus 206 or external bus attached hard disk drive ("HDD") storage controller.

In one embodiment, the master controller 224 communicates with one or more storage controllers 254 where the storage device/solid-state storage device 102 may appear as a storage device connected through a SCSI bus, Internet SCSI ("iSCSI"), fiber channel, etc. Meanwhile the storage device/solid-state storage device 102 may autonomously manage objects and may appear as an object file system or distributed object file system. The master controller 224 may also be accessed by peer controllers 256 and/or application specific processors 258.

In another embodiment, the master controller 224 coordinates with an autonomous integrated management controller to periodically validate FPGA code and/or controller software, validate FPGA code while running (reset) and/or validate controller software during power on (reset), support external reset requests, support reset requests due to watchdog timeouts, and support voltage, current, power, temperature, and other environmental measurements and setting of threshold interrupts. In another embodiment, the master controller 224 manages garbage collection to free erase blocks for reuse. In another embodiment, the master controller 224 manages wear leveling. In another embodiment, the master controller 224 allows the data storage device/solid-state storage device 102 to be partitioned into multiple virtual devices and allows partition-based media encryption. In yet another embodiment, the master controller 224 supports a solid-state storage controller 104 with advanced, multi-bit ECC correction. One of skill in the art will recognize other features and functions of a master controller 224 in a storage controller 202, or more specifically in a solid-state storage device 102.

In one embodiment, the solid-state storage device controller 202 includes a memory controller 228 which controls a dynamic random memory array 230 and/or a static random memory array 232. As stated above, the memory controller 228 may be independent or integrated with the master controller 224. The memory controller 228 typically controls volatile memory of some type, such as DRAM (dynamic random memory array 230) and SRAM (static random memory array 232). In other examples, the memory controller 228 also controls other memory types such as electrically erasable programmable read only memory ("EEPROM"), etc. In other embodiments, the memory controller 228 controls two or more memory types and the memory controller 228 may include more than one controller. Typically, the memory controller 228 controls as much SRAM 232 as is feasible and by DRAM 230 to supplement the SRAM 232.

In one embodiment, the object index is stored in memory 230, 232 and then periodically off-loaded to a channel of the solid-state storage media 110n or other non-volatile memory. One of skill in the art will recognize other uses and configurations of the memory controller 228, dynamic memory array 230, and static memory array 232.

In one embodiment, the solid-state storage device controller 202 includes a DMA controller 226 that controls DMA operations between the storage device/solid-state storage device 102 and one or more external memory controllers 250 and associated external memory arrays 252 and CPUs 248. Note that the external memory controllers 250 and external memory arrays 252 are called external because they are external to the storage device/solid-state storage device 102. In addition, the DMA controller 226 may also control RDMA operations with requesting devices through a NIC 244 and associated RDMA controller 246.

In one embodiment, the solid-state storage device controller 202 includes a management controller 234 connected to a management bus 236. Typically, the management controller 234 manages environmental metrics and status of the storage device/solid-state storage device 102. The management controller 234 may monitor device temperature, fan speed, power supply settings, etc. over the management bus 236.

The management controller 234 may support the reading and programming of erasable programmable read only memory ("EEPROM") for storage of FPGA code and controller software. Typically, the management bus 236 is connected to the various components within the storage device/solid-state storage device 102. The management controller 234 may communicate alerts, interrupts, etc. over the local bus 206 or may include a separate connection to a system bus 240 or other bus. In one embodiment, the management bus 236 is an Inter-Integrated Circuit ("I2C") bus. One of skill in the art will recognize other related functions and uses of a management controller 234 connected to components of the storage device/solid-state storage device 102 by a management bus 236.

In one embodiment, the solid-state storage device controller 202 includes miscellaneous logic 242 that may be customized for a specific application. Typically, where the solid-state device controller 202 or master controller 224 is/are configured using a FPGA or other configurable controller, custom logic may be included based on a particular application, customer requirement, storage requirement, etc.

Data Pipeline

Figure 3:
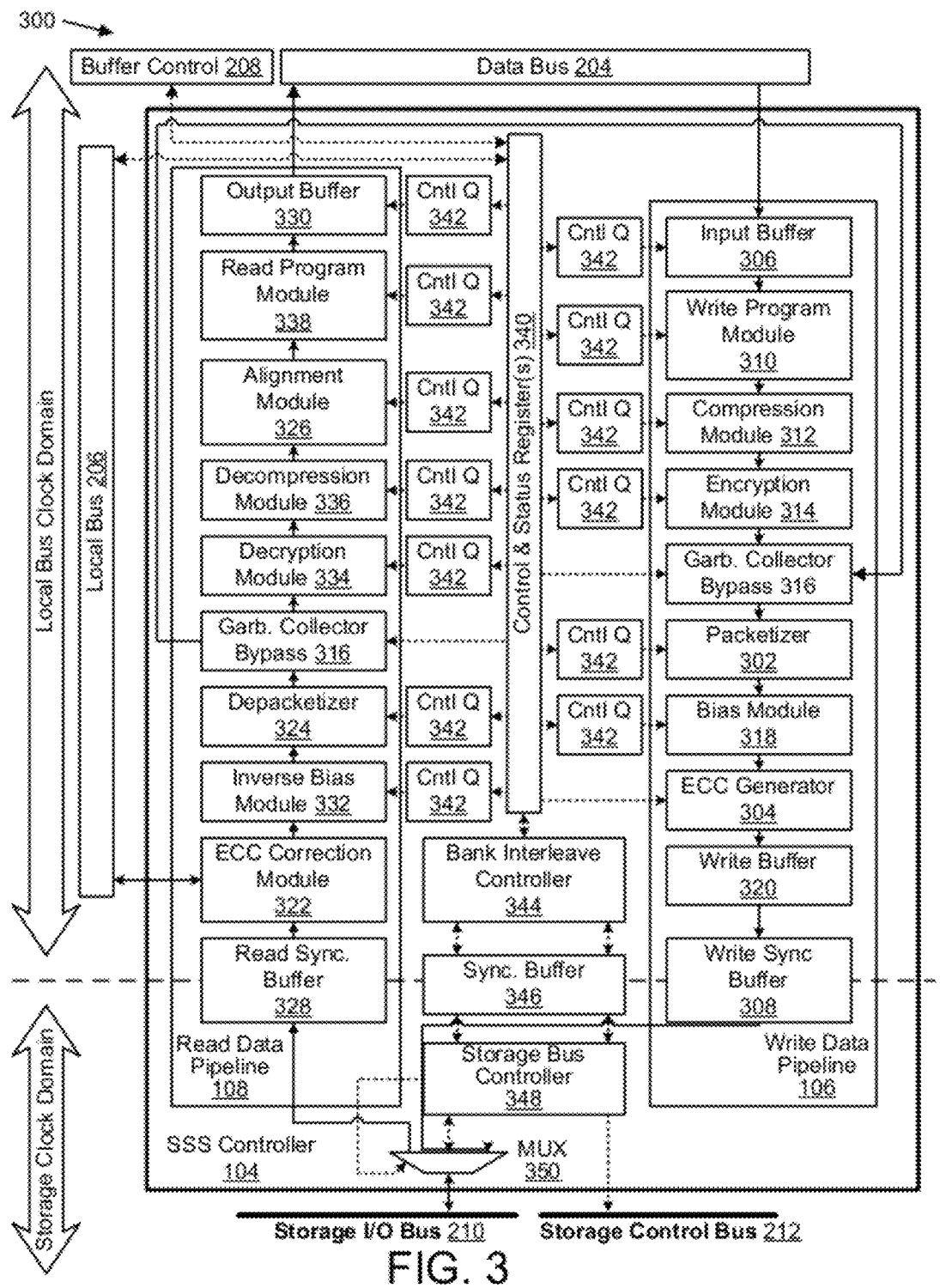
FIG. 3 is a schematic block diagram illustrating one embodiment of a solid-state storage controller with a write data pipeline and a read data pipeline in a solid-state storage device in accordance with the present invention.

FIG. 3 is a schematic block diagram illustrating one embodiment 300 of a solid-state storage controller 104 with a write data pipeline 106 and a read data pipeline 108 in a solid-state storage device 102 in accordance with the present invention. The embodiment 300 includes a data bus 204, a local bus 206, and buffer control 208, which are substantially similar to those described in relation to the solid-state storage device controller 202 of FIG. 2. The write data pipeline 106 includes a packetizer 302 and an error-correcting code ("ECC") generator 304. In other embodiments, the write data pipeline 106 includes an input buffer 306, a write synchronization buffer 308, a write program module 310, a compression module 312, an encryption module 314, a garbage collector bypass 316 (with a portion within the read data pipeline 108), a media encryption module 318, and a write buffer 320. The read data pipeline 108 includes a read synchronization buffer 328, an ECC correction module 322, a depacketizer 324, an alignment module 326, and an output buffer 330. In other embodiments, the read data pipeline 108 may include a media decryption module 332, a portion of the garbage collector bypass 316, a decryption module 334, a decompression module 336, and a read program module 338. The solid-state storage controller 104 may also include control and status registers 340 and control queues 342, a bank interleave controller 344, a synchronization buffer 346, a storage bus controller 348, and a multiplexer ("MUX") 350. The components of the solid-state controller 104 and associated write data pipeline 106 and read data pipeline 108 are described below. In other embodiments, synchronous solid-state storage media 110 may be used and synchronization buffers 308 328 may be eliminated.

Write Data Pipeline

The write data pipeline 106 includes a packetizer 302 that receives a data or metadata segment to be written to the solid-state storage, either directly or indirectly through another write data pipeline 106 stage, and creates one or more packets sized for the solid-state storage media 110. The data or metadata segment is typically part of a data structure such as an object, but may also include an entire data structure. In another embodiment, the data segment is part of a block of data, but may also include an entire block of data. Typically, a set of data such as a data structure is received from a computer such as the host device 114, or other computer or device and is transmitted to the solid-state storage device 102 in data segments streamed to the solid-state storage device 102 and/or the host device 114. A data segment may also be known by another name, such as data parcel, but as referenced herein includes all or a portion of a data structure or data block.

Each data structure is stored as one or more packets. Each data structure may have one or more container packets. Each packet contains a header. The header may include a header type field. Type fields may include data, attribute, metadata, data segment delimiters (multi-packet), data structures, data linkages, and the like. The header may also include information regarding the size of the packet, such as the number of bytes of data included in the packet. The length of the packet may be established by the packet type. The header may include information that establishes the relationship of the packet to a data structure. An example might be the use of an offset in a data packet header to identify the location of the data segment within the data structure. One of skill in the art will recognize other information that may be included in a header added to data by a packetizer 302 and other information that may be added to a data packet.

Each packet includes a header and possibly data from the data or metadata segment. The header of each packet includes pertinent information to relate the packet to the data structure to which the packet belongs. For example, the header may include an object identifier or other data structure identifier and offset that indicate the data segment, object, data structure, or data block from which the data packet was formed. The header may also include a logical address used by the storage bus controller 348 to store the packet. The header may also include information regarding the size of the packet, such as the number of bytes included in the packet. The header may also include a sequence number that identifies where the data segment belongs with respect to other packets within the data structure when reconstructing the data segment or data structure. The header may include a header type field. Type fields may include data, data structure attributes, metadata, data segment delimiters (multi-packet), data structure types, data structure linkages, and the like. One of skill in the art will recognize other information that may be included in a header added to data or metadata by a packetizer 302 and other information that may be added to a packet.

The write data pipeline 106 includes an ECC generator 304 that that generates one or more error-correcting codes ("ECC") for the one or more packets received from the packetizer 302. The ECC generator 304 typically uses an error correcting algorithm to generate ECC check bits which are stored with the one or more data packets. The ECC codes generated by the ECC generator 304 together with the one or more data packets associated with the ECC codes comprise an ECC chunk. The ECC data stored with the one or more data packets is used to detect and to correct errors introduced into the data through transmission and storage. In one embodiment, packets are streamed into the ECC generator 304 as un-encoded blocks of length N. A syndrome of length S is calculated, appended and output as an encoded block of length N+S. The value of N and S are dependent upon the characteristics of the algorithm which is selected to achieve specific performance, efficiency, and robustness metrics. In one embodiment, there is no fixed relationship between the ECC blocks and the packets; the packet may comprise more than one ECC block; the ECC block may comprise more than one packet; and a first packet may end anywhere within the ECC block and a second packet may begin after the end of the first packet within the same ECC block. In one embodiment, ECC algorithms are not dynamically modified. In one embodiment, the ECC data stored with the data packets is robust enough to correct errors in more than two bits.

Beneficially, using a robust ECC algorithm allowing more than single bit correction or even double bit correction allows the life of the solid-state storage media 110 to be extended. For example, if flash memory is used as the storage medium in the solid-state storage media 110, the flash memory may be written approximately 100,000 times without error per erase cycle. This usage limit may be extended using a robust ECC algorithm. Having the ECC generator 304 and corresponding ECC correction module 322 onboard the solid-state storage device 102, the solid-state storage device 102 can internally correct errors and has a longer useful life than if a less robust ECC algorithm is used, such as single bit correction. However, in other embodiments the ECC generator 304 may use a less robust algorithm and may correct single-bit or double-bit errors. In another embodiment, the solid-state storage device 102 may comprise less reliable storage such as multi-level cell ("MLC") flash in order to increase capacity, which storage may not be sufficiently reliable without more robust ECC algorithms.

In one embodiment, the write pipeline 106 includes an input buffer 306 that receives a data segment to be written to the solid-state storage media 110 and stores the incoming data segments until the next stage of the write data pipeline 106, such as the packetizer 302 (or other stage for a more complex write data pipeline 106) is ready to process the next data segment. The input buffer 306 typically allows for discrepancies between the rate data segments are received and processed by the write data pipeline 106 using an appropriately sized data buffer. The input buffer 306 also allows the data bus 204 to transfer data to the write data pipeline 106 at rates greater than can be sustained by the write data pipeline 106 in order to improve efficiency of operation of the data bus 204. Typically when the write data pipeline 106 does not include an input buffer 306, a buffering function is performed elsewhere, such as in the solid-state storage device 102, but outside the write data pipeline 106, in the host device 114, such as within a network interface card ("NIC"), or at another device, for example when using remote direct memory access ("RDMA").

In another embodiment, the write data pipeline 106 also includes a write synchronization buffer 308 that buffers packets received from the ECC generator 304 prior to writing the packets to the solid-state storage media 110. The write synch buffer 308 is located at a boundary between a local clock domain and a solid-state storage clock domain and provides buffering to account for the clock domain differences. In other embodiments, synchronous solid-state storage media 110 may be used and synchronization buffers 308 328 may be eliminated.

In one embodiment, the write data pipeline 106 also includes a media encryption module 318 that receives the one or more packets from the packetizer 302, either directly or indirectly, and encrypts the one or more packets using an encryption key unique to the solid-state storage device 102 prior to sending the packets to the ECC generator 304. Typically, the entire packet is encrypted, including the headers. In another embodiment, headers are not encrypted. In this document, encryption key is understood to mean a secret encryption key that is managed externally from a solid-state storage controller 104.

The media encryption module 318 and corresponding media decryption module 332 provide a level of security for data stored in the solid-state storage media 110. For example, where data is encrypted with the media encryption module 318, if the solid-state storage media 110 is connected to a different solid-state storage controller 104, solid-state storage device 102, or server, the contents of the solid-state storage media 110 typically could not be read without use of the same encryption key used during the write of the data to the solid-state storage media 110 without significant effort.

In a typical embodiment, the solid-state storage device 102 does not store the encryption key in non-volatile storage and allows no external access to the encryption key. The encryption key is provided to the solid-state storage controller 104 during initialization. The solid-state storage device 102 may use and store a non-secret cryptographic nonce that is used in conjunction with an encryption key. A different nonce may be stored with every packet. Data segments may be split between multiple packets with unique nonces for the purpose of improving protection by the encryption algorithm.

The encryption key may be received from a host device 114, a server, key manager, or other device that manages the encryption key to be used by the solid-state storage controller 104. In another embodiment, the solid-state storage media 110 may have two or more partitions and the solid-state storage controller 104 behaves as though it was two or more solid-state storage controllers 104, each operating on a single partition within the solid-state storage media 110. In this embodiment, a unique media encryption key may be used with each partition.

In another embodiment, the write data pipeline 106 also includes an encryption module 314 that encrypts a data or metadata segment received from the input buffer 306, either directly or indirectly, prior sending the data segment to the packetizer 302, the data segment encrypted using an encryption key received in conjunction with the data segment. The encryption keys used by the encryption module 314 to encrypt data may not be common to all data stored within the solid-state storage device 102 but may vary on an per data structure basis and received in conjunction with receiving data segments as described below. For example, an encryption key for a data segment to be encrypted by the encryption module 314 may be received with the data segment or may be received as part of a command to write a data structure to which the data segment belongs. The solid-state storage device 102 may use and store a non-secret cryptographic nonce in each data structure packet that is used in conjunction with the encryption key. A different nonce may be stored with every packet. Data segments may be split between multiple packets with unique nonces for the purpose of improving protection by the encryption algorithm.

The encryption key may be received from a host device 114, a computer, key manager, or other device that holds the encryption key to be used to encrypt the data segment. In one embodiment, encryption keys are transferred to the solid-state storage controller 104 from one of a solid-state storage device 102, a computer, a host device 114, or other external agent, which has the ability to execute industry standard methods to securely transfer and protect private and public keys.

In one embodiment, the encryption module 314 encrypts a first packet with a first encryption key received in conjunction with the packet and encrypts a second packet with a second encryption key received in conjunction with the second packet. In another embodiment, the encryption module 314 encrypts a first packet with a first encryption key received in conjunction with the packet and passes a second data packet on to the next stage without encryption. Beneficially, the encryption module 314 included in the write data pipeline 106 of the solid-state storage device 102 allows data structure-by-data structure or segment-by-segment data encryption without a single file system or other external system to keep track of the different encryption keys used to store corresponding data structures or data segments. Each requesting device 155 or related key manager independently manages encryption keys used to encrypt only the data structures or data segments sent by the requesting device 155.

In one embodiment, the encryption module 314 may encrypt the one or more packets using an encryption key unique to the solid-state storage device 102. The encryption module 314 may perform this media encryption independently, or in addition to the encryption described above. Typically, the entire packet is encrypted, including the headers. In another embodiment, headers are not encrypted. The media encryption by the encryption module 314 provides a level of security for data stored in the solid-state storage media 110. For example, where data is encrypted with media encryption unique to the specific solid-state storage device 102 if the solid-state storage media 110 is connected to a different solid-state storage controller 104, solid-state storage device 102, or host device 114, the contents of the solid-state storage media 110 typically could not be read without use of the same encryption key used during the write of the data to the solid-state storage media 110 without significant effort.

In another embodiment, the write data pipeline 106 includes a compression module 312 that compresses the data for metadata segment prior to sending the data segment to the packetizer 302. The compression module 312 typically compresses a data or metadata segment using a compression routine known to those of skill in the art to reduce the storage size of the segment. For example, if a data segment includes a string of 512 zeros, the compression module 312 may replace the 512 zeros with code or token indicating the 512 zeros where the code is much more compact than the space taken by the 512 zeros.

In one embodiment, the compression module 312 compresses a first segment with a first compression routine and passes along a second segment without compression. In another embodiment, the compression module 312 compresses a first segment with a first compression routine and compresses the second segment with a second compression routine. Having this flexibility within the solid-state storage device 102 is beneficial so that the host device 114 or other devices writing data to the solid-state storage device 102 may each specify a compression routine or so that one can specify a compression routine while another specifies no compression. Selection of compression routines may also be selected according to default settings on a per data structure type or data structure class basis. For example, a first data structure of a specific data structure may be able to override default compression routine settings and a second data structure of the same data structure class and data structure type may use the default compression routine and a third data structure of the same data structure class and data structure type may use no compression.

In one embodiment, the write data pipeline 106 includes a garbage collector bypass 316 that receives data segments from the read data pipeline 108 as part of a data bypass in a garbage collection system. A garbage collection system typically marks packets that are no longer valid, typically because the packet is marked for deletion or has been modified and the modified data is stored in a different location. At some point, the garbage collection system determines that a particular section of storage may be recovered. This determination may be due to a lack of available storage capacity, the percentage of data marked as invalid reaching a threshold, a consolidation of valid data, an error detection rate for that section of storage reaching a threshold, or improving performance based on data distribution, etc. Numerous factors may be considered by a garbage collection algorithm to determine when a section of storage is to be recovered.

Once a section of storage has been marked for recovery, valid packets in the section typically must be relocated. The garbage collector bypass 316 allows packets to be read into the read data pipeline 108 and then transferred directly to the write data pipeline 106 without being routed out of the solid-state storage controller 104. In one embodiment, the garbage collector bypass 316 is part of an autonomous garbage collector system that operates within the solid-state storage device 102. This allows the solid-state storage device 102 to manage data so that data is systematically spread throughout the solid-state storage media 110 to improve performance, data reliability and to avoid overuse and underuse of any one location or area of the solid-state storage media 110 and to lengthen the useful life of the solid-state storage media 110.

The garbage collector bypass 316 coordinates insertion of segments into the write data pipeline 106 with other segments being written by a host device 114 or other devices. In the depicted embodiment, the garbage collector bypass 316 is before the packetizer 302 in the write data pipeline 106 and after the depacketizer 324 in the read data pipeline 108, but may also be located elsewhere in the read and write data pipelines 106, 108. The garbage collector bypass 316 may be used during a flush of the write pipeline 108 to fill the remainder of the virtual page in order to improve the efficiency of storage within the solid-state storage media 110 and thereby reduce the frequency of garbage collection.

In one embodiment, the write data pipeline 106 includes a write buffer 320 that buffers data for efficient write operations. Typically, the write buffer 320 includes enough capacity for packets to fill at least one virtual page in the solid-state storage media 110. This allows a write operation to send an entire page of data to the solid-state storage media 110 without interruption. By sizing the write buffer 320 of the write data pipeline 106 and buffers within the read data pipeline 108 to be the same capacity or larger than a storage write buffer within the solid-state storage media 110, writing and reading data is more efficient since a single write command may be crafted to send a full virtual page of data to the solid-state storage media 110 instead of multiple commands.

While the write buffer 320 is being filled, the solid-state storage media 110 may be used for other read operations. This is advantageous because other solid-state devices with a smaller write buffer or no write buffer may tie up the solid-state storage when data is written to a storage write buffer and data flowing into the storage write buffer stalls. Read operations will be blocked until the entire storage write buffer is filled and programmed. Another approach for systems without a write buffer or a small write buffer is to flush the storage write buffer that is not full in order to enable reads. Again this is inefficient because multiple write/program cycles are required to fill a page.

For depicted embodiment with a write buffer 320 sized larger than a virtual page, a single write command, which includes numerous subcommands, can then be followed by a single program command to transfer the page of data from the storage write buffer in each solid-state storage element 216, 218, 220 to the designated page within each solid-state storage element 216, 218, 220. This technique has the benefits of eliminating partial page programming, which is known to reduce data reliability and durability and freeing up the destination bank for reads and other commands while the buffer fills.

In one embodiment, the write buffer 320 is a ping-pong buffer where one side of the buffer is filled and then designated for transfer at an appropriate time while the other side of the ping-pong buffer is being filled. In another embodiment, the write buffer 320 includes a first-in first-out ("FIFO") register with a capacity of more than a virtual page of data segments. One of skill in the art will recognize other write buffer 320 configurations that allow a virtual page of data to be stored prior to writing the data to the solid-state storage media 110.

In another embodiment, the write buffer 320 is sized smaller than a virtual page so that less than a page of information could be written to a storage write buffer in the solid-state storage media 110. In the embodiment, to prevent a stall in the write data pipeline 106 from holding up read operations, data is queued using the garbage collection system that needs to be moved from one location to another as part of the garbage collection process. In case of a data stall in the write data pipeline 106, the data can be fed through the garbage collector bypass 316 to the write buffer 320 and then on to the storage write buffer in the solid-state storage media 110 to fill the pages of a virtual page prior to programming the data. In this way a data stall in the write data pipeline 106 would not stall reading from the solid-state storage device 102.

In another embodiment, the write data pipeline 106 includes a write program module 310 with one or more user-definable functions within the write data pipeline 106. The write program module 310 allows a user to customize the write data pipeline 106. A user may customize the write data pipeline 106 based on a particular data requirement or application. Where the solid-state storage controller 104 is an FPGA, the user may program the write data pipeline 106 with custom commands and functions relatively easily. A user may also use the write program module 310 to include custom functions with an ASIC, however, customizing an ASIC may be more difficult than with an FPGA. The write program module 310 may include buffers and bypass mechanisms to allow a first data segment to execute in the write program module 310 while a second data segment may continue through the write data pipeline 106. In another embodiment, the write program module 310 may include a processor core that can be programmed through software.

Note that the write program module 310 is shown between the input buffer 306 and the compression module 312, however, the write program module 310 could be anywhere in the write data pipeline 106 and may be distributed among the various stages 302-320. In addition, there may be multiple write program modules 310 distributed among the various states 302-320 that are programmed and operate independently. In addition, the order of the stages 302-320 may be altered. One of skill in the art will recognize workable alterations to the order of the stages 302-320 based on particular user requirements.

Read Data Pipeline

The read data pipeline 108 includes an ECC correction module 322 that determines if a data error exists in ECC blocks a requested packet received from the solid-state storage media 110 by using ECC stored with each ECC block of the requested packet. The ECC correction module 322 then corrects any errors in the requested packet if any error exists and the errors are correctable using the ECC. For example, if the ECC can detect an error in six bits but can only correct three bit errors, the ECC correction module 322 corrects ECC blocks of the requested packet with up to three bits in error. The ECC correction module 322 corrects the bits in error by changing the bits in error to the correct one or zero state so that the requested data packet is identical to when it was written to the solid-state storage media 110 and the ECC was generated for the packet.

If the ECC correction module 322 determines that the requested packets contains more bits in error than the ECC can correct, the ECC correction module 322 cannot correct the errors in the corrupted ECC blocks of the requested packet and sends an interrupt. In one embodiment, the ECC correction module 322 sends an interrupt with a message indicating that the requested packet is in error. The message may include information that the ECC correction module 322 cannot correct the errors or the inability of the ECC correction module 322 to correct the errors may be implied. In another embodiment, the ECC correction module 322 sends the corrupted ECC blocks of the requested packet with the interrupt and/or the message.

In one embodiment, a corrupted ECC block or portion of a corrupted ECC block of the requested packet that cannot be corrected by the ECC correction module 322 is read by the master controller 224, corrected, and returned to the ECC correction module 322 for further processing by the read data pipeline 108. In one embodiment, a corrupted ECC block or portion of a corrupted ECC block of the requested packet is sent to the device requesting the data. The requesting device 155 may correct the ECC block or replace the data using another copy, such as a backup or mirror copy, and then may use the replacement data of the requested data packet or return it to the read data pipeline 108. The requesting device 155 may use header information in the requested packet in error to identify data required to replace the corrupted requested packet or to replace the data structure to which the packet belongs. In another embodiment, the solid-state storage controller 104 stores data using some type of RAID and is able to recover the corrupted data. In another embodiment, the ECC correction module 322 sends an interrupt and/or message and the receiving device fails the read operation associated with the requested data packet. One of skill in the art will recognize other options and actions to be taken as a result of the ECC correction module 322 determining that one or more ECC blocks of the requested packet are corrupted and that the ECC correction module 322 cannot correct the errors.

The read data pipeline 108 includes a depacketizer 324 that receives ECC blocks of the requested packet from the ECC correction module 322, directly or indirectly, and checks and removes one or more packet headers. The depacketizer 324 may validate the packet headers by checking packet identifiers, data length, data location, etc. within the headers. In one embodiment, the header includes a hash code that can be used to validate that the packet delivered to the read data pipeline 108 is the requested packet. The depacketizer 324 also removes the headers from the requested packet added by the packetizer 302. The depacketizer 324 may directed to not operate on certain packets but pass these forward without modification. An example might be a container label that is requested during the course of a rebuild process where the header information is required for index reconstruction. Further examples include the transfer of packets of various types destined for use within the solid-state storage device 102. In another embodiment, the depacketizer 324 operation may be packet type dependent.

The read data pipeline 108 includes an alignment module 326 that receives data from the depacketizer 324 and removes unwanted data. In one embodiment, a read command sent to the solid-state storage media 110 retrieves a packet of data. A device requesting the data may not require all data within the retrieved packet and the alignment module 326 removes the unwanted data. If all data within a retrieved page is requested data, the alignment module 326 does not remove any data.

The alignment module 326 re-formats the data as data segments of a data structure in a form compatible with a device requesting the data segment prior to forwarding the data segment to the next stage. Typically, as data is processed by the read data pipeline 108, the size of data segments or packets changes at various stages. The alignment module 326 uses received data to format the data into data segments suitable to be sent to the requesting device 155 and joined to form a response. For example, data from a portion of a first data packet may be combined with data from a portion of a second data packet. If a data segment is larger than a data requested by the requesting device 155, the alignment module 326 may discard the unwanted data.

In one embodiment, the read data pipeline 108 includes a read synchronization buffer 328 that buffers one or more requested packets read from the solid-state storage media 110 prior to processing by the read data pipeline 108. The read synchronization buffer 328 is at the boundary between the solid-state storage clock domain and the local bus clock domain and provides buffering to account for the clock domain differences.

In another embodiment, the read data pipeline 108 includes an output buffer 330 that receives requested packets from the alignment module 326 and stores the packets prior to transmission to the requesting device 155. The output buffer 330 accounts for differences between when data segments are received from stages of the read data pipeline 108 and when the data segments are transmitted to other parts of the solid-state storage controller 104 or to the requesting device 155. The output buffer 330 also allows the data bus 204 to receive data from the read data pipeline 108 at rates greater than can be sustained by the read data pipeline 108 in order to improve efficiency of operation of the data bus 204.

In one embodiment, the read data pipeline 108 includes a media decryption module 332 that receives one or more encrypted requested packets from the ECC correction module 322 and decrypts the one or more requested packets using the encryption key unique to the solid-state storage device 102 prior to sending the one or more requested packets to the depacketizer 324. Typically, the encryption key used to decrypt data by the media decryption module 332 is identical to the encryption key used by the media encryption module 318. In another embodiment, the solid-state storage media 110 may have two or more partitions and the solid-state storage controller 104 behaves as though it was two or more solid-state storage controllers 104 each operating on a single partition within the solid-state storage media 110. In this embodiment, a unique media encryption key may be used with each partition.

In another embodiment, the read data pipeline 108 includes a decryption module 334 that decrypts a data segment formatted by the depacketizer 324 prior to sending the data segment to the output buffer 330. The data segment may be decrypted using an encryption key received in conjunction with the read request that initiates retrieval of the requested packet received by the read synchronization buffer 328. The decryption module 334 may decrypt a first packet with an encryption key received in conjunction with the read request for the first packet and then may decrypt a second packet with a different encryption key or may pass the second packet on to the next stage of the read data pipeline 108 without decryption. When the packet was stored with a non-secret cryptographic nonce, the nonce is used in conjunction with an encryption key to decrypt the data packet. The encryption key may be received from a host device 114, a computer, key manager, or other device that manages the encryption key to be used by the solid-state storage controller 104.

In another embodiment, the read data pipeline 108 includes a decompression module 336 that decompresses a data segment formatted by the depacketizer 324. In one embodiment, the decompression module 336 uses compression information stored in one or both of the packet header and the container label to select a complementary routine to that used to compress the data by the compression module 312. In another embodiment, the decompression routine used by the decompression module 336 is dictated by the device requesting the data segment being decompressed. In another embodiment, the decompression module 336 selects a decompression routine according to default settings on a per data structure type or data structure class basis. A first packet of a first object may be able to override a default decompression routine and a second packet of a second data structure of the same data structure class and data structure type may use the default decompression routine and a third packet of a third data structure of the same data structure class and data structure type may use no decompression.

In another embodiment, the read data pipeline 108 includes a read program module 338 that includes one or more user-definable functions within the read data pipeline 108. The read program module 338 has similar characteristics to the write program module 310 and allows a user to provide custom functions to the read data pipeline 108. The read program module 338 may be located as shown in FIG. 3, may be located in another position within the read data pipeline 108, or may include multiple parts in multiple locations within the read data pipeline 108. Additionally, there may be multiple read program modules 338 within multiple locations within the read data pipeline 108 that operate independently. One of skill in the art will recognize other forms of a read program module 338 within a read data pipeline 108. As with the write data pipeline 106, the stages of the read data pipeline 108 may be rearranged and one of skill in the art will recognize other orders of stages within the read data pipeline 108.

The solid-state storage controller 104 includes control and status registers 340 and corresponding control queues 342. The control and status registers 340 and control queues 342 facilitate control and sequencing commands and subcommands associated with data processed in the write and read data pipelines 106, 108. For example, a data segment in the packetizer 302 may have one or more corresponding control commands or instructions in a control queue 342 associated with the ECC generator 304. As the data segment is packetized, some of the instructions or commands may be executed within the packetizer 302. Other commands or instructions may be passed to the next control queue 342 through the control and status registers 340 as the newly formed data packet created from the data segment is passed to the next stage.

Commands or instructions may be simultaneously loaded into the control queues 342 for a packet being forwarded to the write data pipeline 106 with each pipeline stage pulling the appropriate command or instruction as the respective packet is executed by that stage. Similarly, commands or instructions may be simultaneously loaded into the control queues 342 for a packet being requested from the read data pipeline 108 with each pipeline stage pulling the appropriate command or instruction as the respective packet is executed by that stage. One of skill in the art will recognize other features and functions of control and status registers 340 and control queues 342.

Figure 4:
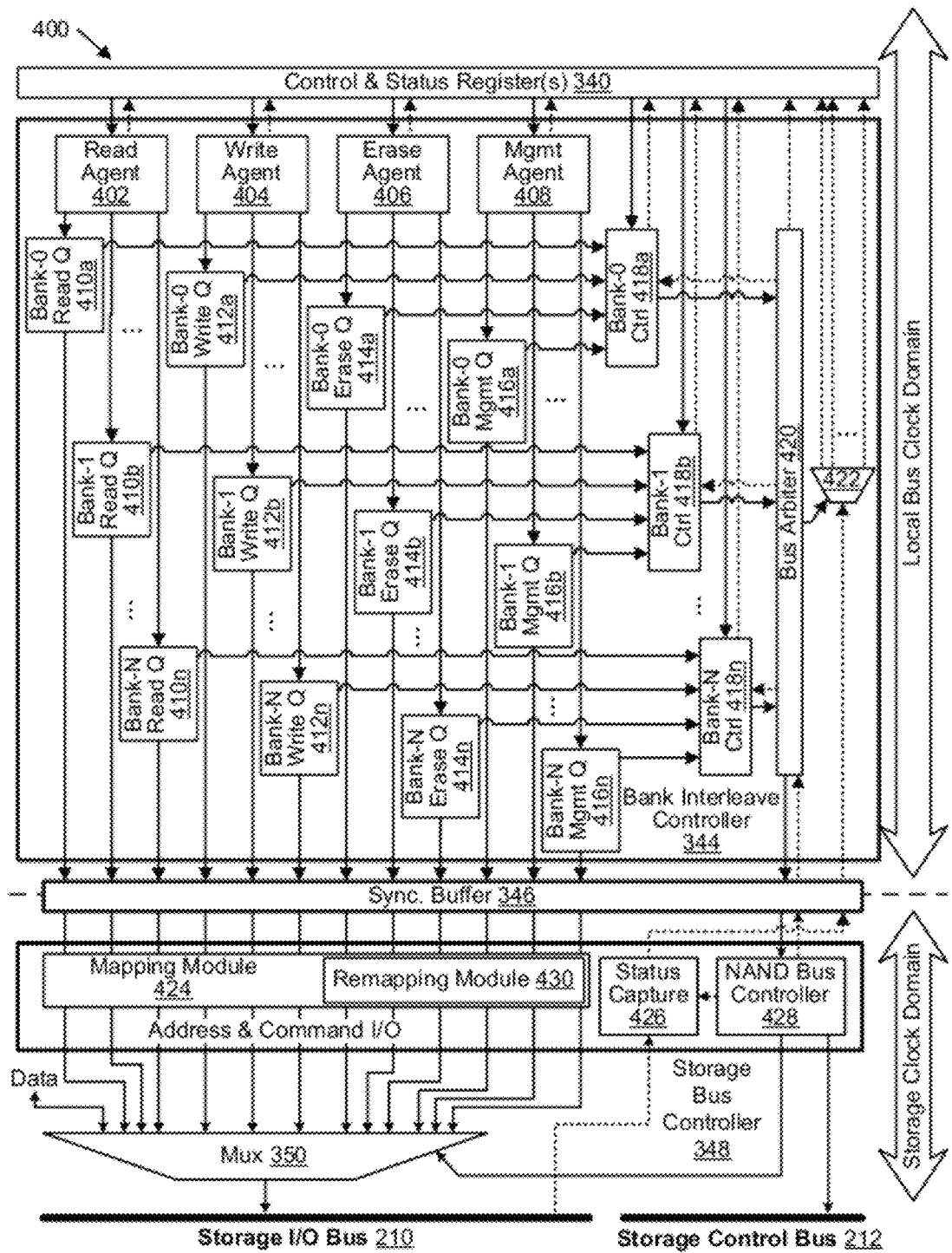
FIG. 4 is a schematic block diagram illustrating one embodiment of a bank interleave controller in the solid-state storage controller in accordance with the present invention.

The solid-state storage controller 104 and or the solid-state storage device 102 may also include a bank interleave controller 344, a synchronization buffer 346, a storage bus controller 348, and a multiplexer ("MUX") 350, which are described in relation to FIG. 4.

Bank Interleave

FIG. 4 is a schematic block diagram illustrating one embodiment 400 of a bank interleave controller 344 in the solid-state storage controller 104 in accordance with the present invention. The bank interleave controller 344 is connected to the control and status registers 340 and to the storage I/O bus 210 and storage control bus 212 through the MUX 350, storage bus controller 348, and synchronization buffer 346, which are described below. The bank interleave controller 344 includes a read agent 402, a write agent 404, an erase agent 406, a management agent 408, read queues 410a-n, write queues 412a-n, erase queues 414a-n, and management queues 416a-n for the banks 214 in the solid-state storage media 110, bank controllers 418a-n, a bus arbiter 420, and a status MUX 422, which are described below. The storage bus controller 348 includes a mapping module 424 with a remapping module 430, a status capture module 426, and a NAND bus controller 428, which are described below.

The bank interleave controller 344 directs one or more commands to two or more queues in the bank interleave controller 104 and coordinates among the banks 214 of the solid-state storage media 110 execution of the commands stored in the queues, such that a command of a first type executes on one bank 214a while a command of a second type executes on a second bank 214b. The one or more commands are separated by command type into the queues. Each bank 214 of the solid-state storage media 110 has a corresponding set of queues within the bank interleave controller 344 and each set of queues includes a queue for each command type.

The bank interleave controller 344 coordinates among the banks 214 of the solid-state storage media 110 execution of the commands stored in the queues. For example, a command of a first type executes on one bank 214a while a command of a second type executes on a second bank 214b. Typically the command types and queue types include read and write commands and queues 410, 412, but may also include other commands and queues that are storage media specific. For example, in the embodiment depicted in FIG. 4, erase and management queues 414, 416 are included and would be appropriate for flash memory, NRAM, MRAM, DRAM, PRAM, etc.

For other types of solid-state storage media 110, other types of commands and corresponding queues may be included without straying from the scope of the invention. The flexible nature of an FPGA solid-state storage controller 104 allows flexibility in storage media. If flash memory were changed to another solid-state storage type, the bank interleave controller 344, storage bus controller 348, and MUX 350 could be altered to accommodate the media type without significantly affecting the data pipelines 106, 108 and other solid-state storage controller 104 functions.

In the embodiment depicted in FIG. 4, the bank interleave controller 344 includes, for each bank 214, a read queue 410 for reading data from the solid-state storage media 110, a write queue 412 for write commands to the solid-state storage media 110, an erase queue 414 for erasing an erase block in the solid-state storage, an a management queue 416 for management commands. The bank interleave controller 344 also includes corresponding read, write, erase, and management agents 402, 404, 406, 408. In another embodiment, the control and status registers 340 and control queues 342 or similar components queue commands for data sent to the banks 214 of the solid-state storage media 110 without a bank interleave controller 344.

The agents 402, 404, 406, 408, in one embodiment, direct commands of the appropriate type destined for a particular bank 214a to the correct queue for the bank 214a. For example, the read agent 402 may receive a read command for bank-1 214b and directs the read command to the bank-1 read queue 410b. The write agent 404 may receive a write command to write data to a location in bank-0 214a of the solid-state storage media 110 and will then send the write command to the bank-0 write queue 412a. Similarly, the erase agent 406 may receive an erase command to erase an erase block in bank-1 214b and will then pass the erase command to the bank-1 erase queue 414b. The management agent 408 typically receives management commands, status requests, and the like, such as a reset command or a request to read a configuration register of a bank 214, such as bank-0 214a. The management agent 408 sends the management command to the bank-0 management queue 416a.

The agents 402, 404, 406, 408 typically also monitor status of the queues 410, 412, 414, 416 and send status, interrupt, or other messages when the queues 410, 412, 414, 416 are full, nearly full, non-functional, etc. In one embodiment, the agents 402, 404, 406, 408 receive commands and generate corresponding sub-commands. In one embodiment, the agents 402, 404, 406, 408 receive commands through the control & status registers 340 and generate corresponding sub-commands which are forwarded to the queues 410, 412, 414, 416. One of skill in the art will recognize other functions of the agents 402, 404, 406, 408.

The queues 410, 412, 414, 416 typically receive commands and store the commands until required to be sent to the solid-state storage banks 214. In a typical embodiment, the queues 410, 412, 414, 416 are first-in, first-out ("FIFO") registers or a similar component that operates as a FIFO. In another embodiment, the queues 410, 412, 414, 416 store commands in an order that matches data, order of importance, or other criteria.

The bank controllers 418 typically receive commands from the queues 410, 412, 414, 416 and generate appropriate subcommands. For example, the bank-0 write queue 412a may receive a command to write a page of data packets to bank-0 214a. The bank-0 controller 418a may receive the write command at an appropriate time and may generate one or more write subcommands for each data packet stored in the write buffer 320 to be written to the page in bank-0 214a. For example, bank-0 controller 418a may generate commands to validate the status of bank 0 214a and the solid-state storage array 216, select the appropriate location for writing one or more data packets, clear the input buffers within the solid-state storage memory array 216, transfer the one or more data packets to the input buffers, program the input buffers into the selected location, verify that the data was correctly programmed, and if program failures occur do one or more of interrupting the master controller 224, retrying the write to the same physical location, and retrying the write to a different physical location. Additionally, in conjunction with example write command, the storage bus controller 348 will cause the one or more commands to multiplied to each of the each of the storage I/O buses 210a-n with the logical address of the command mapped to a first physical addresses for storage I/O bus 210a, and mapped to a second physical address for storage I/O bus 210b, and so forth as further described below.

Typically, bus arbiter 420 selects from among the bank controllers 418 and pulls subcommands from output queues within the bank controllers 418 and forwards these to the Storage Bus Controller 348 in a sequence that optimizes the performance of the banks 214. In another embodiment, the bus arbiter 420 may respond to a high level interrupt and modify the normal selection criteria. In another embodiment, the master controller 224 can control the bus arbiter 420 through the control and status registers 340. One of skill in the art will recognize other means by which the bus arbiter 420 may control and interleave the sequence of commands from the bank controllers 418 to the solid-state storage media 110.

The bus arbiter 420 typically coordinates selection of appropriate commands, and corresponding data when required for the command type, from the bank controllers 418 and sends the commands and data to the storage bus controller 348. The bus arbiter 420 typically also sends commands to the storage control bus 212 to select the appropriate bank 214. For the case of flash memory or other solid-state storage media 110 with an asynchronous, bi-directional serial storage I/O bus 210, only one command (control information) or set of data can be transmitted at a time. For example, when write commands or data are being transmitted to the solid-state storage media 110 on the storage I/O bus 210, read commands, data being read, erase commands, management commands, or other status commands cannot be transmitted on the storage I/O bus 210. For example, when data is being read from the storage I/O bus 210, data cannot be written to the solid-state storage media 110.

For example, during a write operation on bank-0 the bus arbiter 420 selects the bank-0 controller 418a which may have a write command or a series of write sub-commands on the top of its queue which cause the storage bus controller 348 to execute the following sequence. The bus arbiter 420 forwards the write command to the storage bus controller 348, which sets up a write command by selecting bank-0 214a through the storage control bus 212, sending a command to clear the input buffers of the solid-state storage elements 110 associated with the bank-0 214a, and sending a command to validate the status of the solid-state storage elements 216, 218, 220 associated with the bank-0 214a.

The storage bus controller 348 then transmits a write subcommand on the storage I/O bus 210, which contains the physical addresses including the address of the logical erase block for each individual physical erase solid-stage storage element 216a-m as mapped from the logical erase block address. The storage bus controller 348 then muxes the write buffer 320 through the write sync buffer 308 to the storage I/O bus 210 through the MUX 350 and streams write data to the appropriate page. When the page is full, then storage bus controller 348 causes the solid-state storage elements 216a-m associated with the bank-0 214a to program the input buffer to the memory cells within the solid-state storage elements 216a-m. Finally, the storage bus controller 348 validates the status to ensure that page was correctly programmed.

A read operation is similar to the write example above. During a read operation, typically the bus arbiter 420, or other component of the bank interleave controller 344, receives data and corresponding status information and sends the data to the read data pipeline 108 while sending the status information on to the control and status registers 340. Typically, a read data command forwarded from bus arbiter 420 to the storage bus controller 348 will cause the MUX 350 to gate the read data on storage I/O bus 210 to the read data pipeline 108 and send status information to the appropriate control and status registers 340 through the status MUX 422.

The bus arbiter 420 coordinates the various command types and data access modes so that only an appropriate command type or corresponding data is on the bus at any given time. If the bus arbiter 420 has selected a write command, and write subcommands and corresponding data are being written to the solid-state storage media 110, the bus arbiter 420 will not allow other command types on the storage I/O bus 210. Beneficially, the bus arbiter 420 uses timing information, such as predicted command execution times, along with status information received concerning bank 214 status to coordinate execution of the various commands on the bus with the goal of minimizing or eliminating idle time of the busses.

The master controller 224 through the bus arbiter 420 typically uses expected completion times of the commands stored in the queues 410, 412, 414, 416, along with status information, so that when the subcommands associated with a command are executing on one bank 214a, other subcommands of other commands are executing on other banks 214b-n. When one command is fully executed on a bank 214a, the bus arbiter 420 directs another command to the bank 214a. The bus arbiter 420 may also coordinate commands stored in the queues 410, 412, 414, 416 with other commands that are not stored in the queues 410, 412, 414, 416.

For example, an erase command may be sent out to erase a group of erase blocks within the solid-state storage media 110. An erase command may take 10 to 1000 times more time to execute than a write or a read command or 10 to 100 times more time to execute than a program command. For N banks 214, the bank interleave controller 344 may split the erase command into N commands, each to erase a virtual erase block of a bank 214a. While bank-0 214a is executing an erase command, the bus arbiter 420 may select other commands for execution on the other banks 214b-n. The bus arbiter 420 may also work with other components, such as the storage bus controller 348, the master controller 224, etc., to coordinate command execution among the buses.

Coordinating execution of commands using the bus arbiter 420, bank controllers 418, queues 410, 412, 414, 416, and agents 402, 404, 406, 408 of the bank interleave controller 344 can dramatically increase performance over other solid-state storage systems without a bank interleave function.

In one embodiment, the solid-state controller 104 includes one bank interleave controller 344 that serves all of the storage elements 216, 218, 220 of the solid-state storage media 110. In another embodiment, the solid-state controller 104 includes a bank interleave controller 344 for each column of storage elements 216a-m, 218a-m, 220a-m. For example, one bank interleave controller 344 serves one column of storage elements SSS 0.0-SSS M.0 216a, 216b, . . . 216m, a second bank interleave controller 344 serves a second column of storage elements SSS 0.1-SSS M.1 218a, 218b, . . . 218m etc.

Storage-Specific Components

The solid-state storage controller 104 includes a synchronization buffer 346 that buffers commands and status messages sent and received from the solid-state storage media 110. The synchronization buffer 346 is located at the boundary between the solid-state storage clock domain and the local bus clock domain and provides buffering to account for the clock domain differences. The synchronization buffer 346, write synchronization buffer 308, and read synchronization buffer 328 may be independent or may act together to buffer data, commands, status messages, etc. In one embodiment, the synchronization buffer 346 is located where there are the fewest number of signals crossing the clock domains. One skilled in the art will recognize that synchronization between clock domains may be arbitrarily moved to other locations within the solid-state storage device 102 in order to optimize some aspect of design implementation.

The solid-state storage controller 104 includes a storage bus controller 348 that interprets and translates commands for data sent to and read from the solid-state storage media 110 and status messages received from the solid-state storage media 110 based on the type of solid-state storage media 110. For example, the storage bus controller 348 may have different timing requirements for different types of storage, storage with different performance characteristics, storage from different manufacturers, etc. The storage bus controller 348 also sends control commands to the storage control bus 212.

In one embodiment, the solid-state storage controller 104 includes a MUX 350 that comprises an array of multiplexers 350a-n where each multiplexer is dedicated to a row in the solid-state storage array 110. For example, multiplexer 350a is associated with solid-state storage elements 216a, 218a, 220a. MUX 350 routes the data from the write data pipeline 106 and commands from the storage bus controller 348 to the solid-state storage media 110 via the storage I/O bus 210 and routes data and status messages from the solid-state storage media 110 via the storage I/O bus 210 to the read data pipeline 108 and the control and status registers 340 through the storage bus controller 348, synchronization buffer 346, and bank interleave controller 344.

In one embodiment, the solid-state storage controller 104 includes a MUX 350 for each column of solid-state storage elements (e.g. SSS 0.0 216a, SSS 1.0 218a, SSS N.0 220a). A MUX 350 combines data from the write data pipeline 106 and commands sent to the solid-state storage 110 via the storage I/O bus 210 and separates data to be processed by the read data pipeline 108 from commands. Packets stored in the write buffer 320 are directed on busses out of the write buffer 320 through a write synchronization buffer 308 for each column of solid-state storage elements (SSS 0.x to SSS N.x 216, 218, 220) to the MUX 350 for each column of solid-state storage elements (SSS 0.x to SSS N.x 216, 218, 220). The commands and read data are received by the MUXes 350 from the storage I/O bus 210. The MUXes 350 also direct status messages to the storage bus controller 348.

The storage bus controller 348 includes a mapping module 424. The mapping module 424 maps a logical address of an erase block to one or more physical addresses of an erase block. For example, a solid-state storage 110 with an array of twenty storage elements (e.g. SSS 0.0 to SSS 0.M 216) per bank 214a may have a logical address for a particular erase block mapped to twenty physical addresses of the erase block, one physical address per storage element. Because the storage elements are accessed in parallel, erase blocks at the same position in each storage element in a column of storage elements 216a, 218a, 220a will share a physical address. To select one erase block (e.g. in storage element SSS 0.0 216a) instead of all erase blocks in the column (e.g. in storage elements SSS 0.0, 1.0, . . . N.0 216a, 218a, 220a), one bank (in this case Bank 0 214a) is selected.

This logical-to-physical mapping for erase blocks is beneficial because if one erase block becomes damaged or inaccessible, the mapping can be changed to map to another erase block. This mitigates the loss of losing an entire virtual erase block when one element's erase block is faulty. The remapping module 430 changes a mapping of a logical address of an erase block to one or more physical addresses of a virtual erase block (spread over the array of storage elements). For example, virtual erase block 1 may be mapped to erase block 1 of storage element SSS 0.0 216a, to erase block 1 of storage element SSS 0.1 216b, . . . , and to storage element 0.M 216m, virtual erase block 2 may be mapped to erase block 2 of storage element SSS 1.0 218a, to erase block 2 of storage element SSS 1.1 218b, . . . , and to storage element 1.M 218m, etc. Alternatively, virtual erase block 1 may be mapped to one erase block from each storage element in an array such that virtual erase block 1 includes erase block 1 of storage element SSS 0.0 216a to erase block 1 of storage element SSS 0.1 216b to storage element 0.M 216m, and erase block 1 of storage element SSS 1.0 218a to erase block 1 of storage element SSS 1.1 218b, . . . , and to storage element 1.M 218m, for each storage element in the array up to erase block 1 of storage element N.M 220m.

If erase block 1 of a storage element SSS 0.0 216a is damaged, experiencing errors due to wear, etc., or cannot be used for some reason, the remapping module 430 could change the logical-to-physical mapping for the logical address that pointed to erase block 1 of virtual erase block 1. If a spare erase block (call it erase block 221) of storage element SSS 0.0 216a is available and currently not mapped, the remapping module 430 could change the mapping of virtual erase block 1 to point to erase block 221 of storage element SSS 0.0 216a, while continuing to point to erase block 1 of storage element SSS 0.1 216b, erase block 1 of storage element SSS 0.2 (not shown) . . . , and to storage element 0.M 216m. The mapping module 424 or remapping module 430 could map erase blocks in a prescribed order (virtual erase block 1 to erase block 1 of the storage elements, virtual erase block 2 to erase block 2 of the storage elements, etc.) or may map erase blocks of the storage elements 216, 218, 220 in another order based on some other criteria.

In one embodiment, the erase blocks could be grouped by access time. Grouping by access time, meaning time to execute a command, such as programming (writing) data into pages of specific erase blocks, can level command completion so that a command executed across the erase blocks of a virtual erase block is not limited by the slowest erase block. In other embodiments, the erase blocks may be grouped by wear level, health, etc. One of skill in the art will recognize other factors to consider when mapping or remapping erase blocks.

In one embodiment, the storage bus controller 348 includes a status capture module 426 that receives status messages from the solid-state storage 110 and sends the status messages to the status MUX 422. In another embodiment, when the solid-state storage 110 is flash memory, the storage bus controller 348 includes a NAND bus controller 428. The NAND bus controller 428 directs commands from the read and write data pipelines 106, 108 to the correct location in the solid-state storage 110, coordinates timing of command execution based on characteristics of the flash memory, etc. If the solid-state storage 110 is another solid-state storage type, the NAND bus controller 428 would be replaced by a bus controller specific to the storage type. One of skill in the art will recognize other functions of a NAND bus controller 428.

Logical-to-Physical Translation and Deallocation

Figure 5:
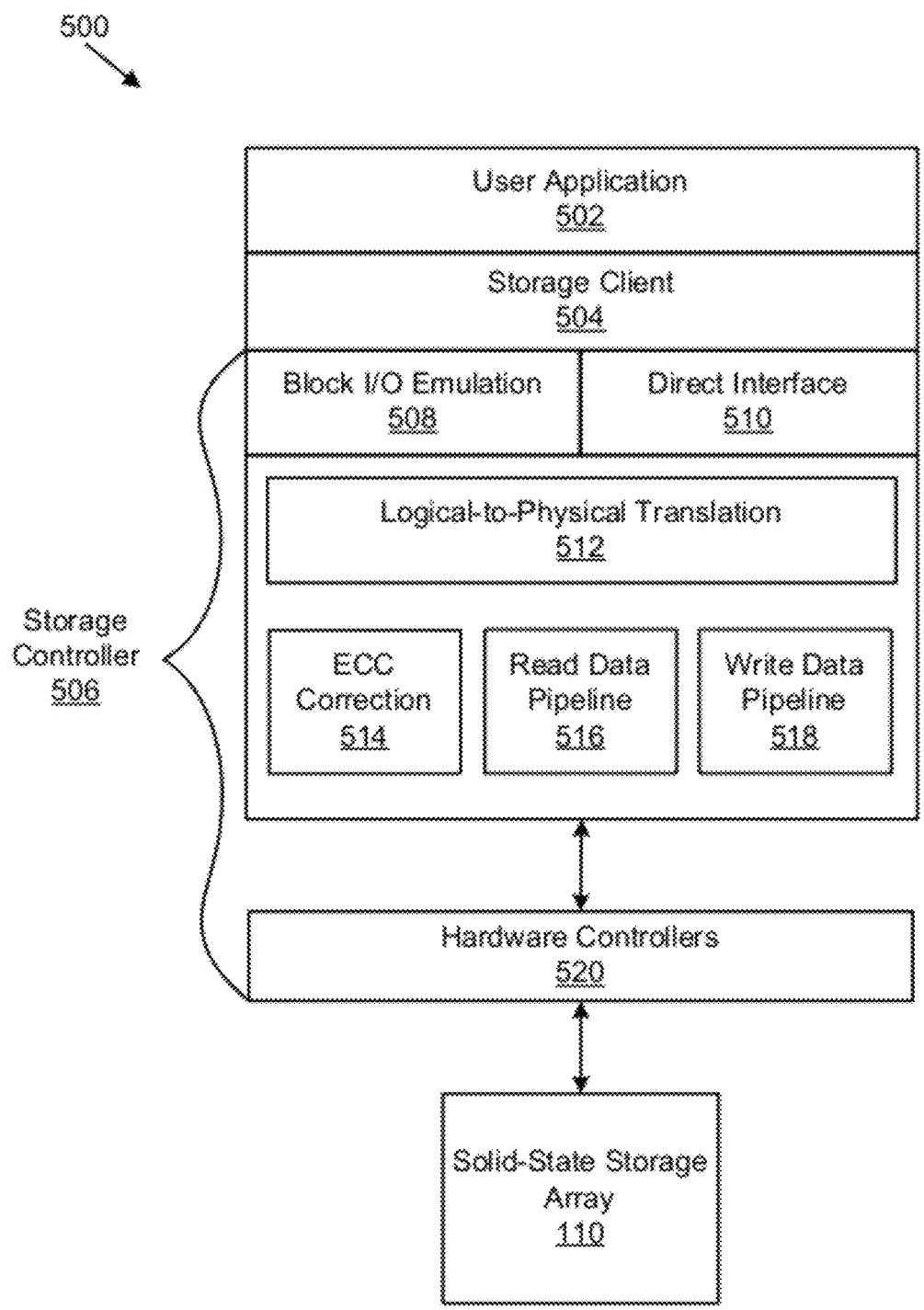
FIG. 5 is a schematic block diagram illustrating one embodiment of a logical representation of a solid-state storage controller with a logical-to-physical translation layer in accordance with the present invention.

FIG. 5 is a schematic block diagram illustrating one embodiment of a logical representation 500 of a solid-state storage controller 506 with a logical-to-physical translation layer 512 in accordance with the present invention. The storage controller 506 may be similar, in certain embodiments, to the solid-state storage controller 104 depicted in FIG. 1 and FIG. 2 and may include one or more solid-state storage controllers 104. The depicted embodiment shows a user application 502 in communication with a storage client 504. The storage client 504 is in communication with a storage controller 506 that includes the logical-to-physical translation layer 512, an ECC correction module 514, a read data pipeline 516, and a write data pipeline 518.

The storage controller 506 manages a solid-state storage array 522. The storage controller 506 may include various hardware and software controllers, drivers, and software, such as the depicted hardware controllers 520.

In one embodiment, the depicted hardware controllers 520 may be substantially similar to and include similar functionality as the solid-state controllers 104 and accompanying controllers and modules depicted in FIG. 2 and/or the bank interleave controller 344 and storage bus controller 348 depicted in FIG. 3. Furthermore, the ECC correction module 514 may be substantially similar and include similar functionality to the ECC correction module 322 and/or the ECC generator 304 depicted in FIG. 3. In addition, the read data pipeline 516 and the write data pipeline 518 may be substantially similar to the read data pipeline 108 and the write data pipeline 106 depicted in FIG. 1 and FIG. 3. The solid-state storage array 522 may include an array of solid-state storage banks similar to the solid-state storage media 110 and corresponding solid-state storage banks 214 depicted in FIG. 2.

In one embodiment, the user application 502 is a software application operating on or in conjunction with the storage client 504. The storage client 504 manages files and data and utilizes the functions and features of the storage controller 506 and associated solid-state storage array 522. Representative examples of storage clients include, but are not limited to, a server, a file system, an operating system, a database management system ("DBMS"), a volume manager, and the like. The storage client 504 is in communication with the storage controller 506. In one embodiment, the storage client 504 communicates through an Input/Output (I/O) interface represented by a block I/O emulation layer 508.

Certain conventional block storage devices divide the storage media into volumes or partitions. Each volume or partition may include a plurality of sectors. One or more sectors are organized into a logical block. In certain storage systems, such as those interfacing with the Windows® operating systems, the logical blocks are referred to as clusters. In other storage systems, such as those interfacing with UNIX, Linux, or similar operating systems, the logical blocks are referred to simply as blocks. A logical block or cluster represents a smallest physical amount of storage space on the storage media that is managed by the storage manager. A block storage device may associate n logical blocks available for user data storage across the storage media with a logical block address, numbered from 0 to n. In certain block storage devices, the logical block addresses may range from 0 to n per volume or partition. In conventional block storage devices, a logical block address maps directly to a particular logical block. In conventional block storage devices, each logical block maps to a particular set of physical sectors on the storage media.

However, certain storage devices 102 do not directly or necessarily associate logical block addresses with particular physical blocks. These storage devices 102 may emulate a conventional block storage interface to maintain compatibility with block storage clients 504.

When the storage client 504 communicates through the block I/O emulation layer 508, the storage device 102 appears to the storage client 504 as a conventional block storage device. In one embodiment, the storage controller 506 provides a block I/O emulation layer 508, which serves as a block device interface, or API. In this embodiment, the storage client 504 communicates with the storage device 102 through this block device interface. In one embodiment, the block I/O emulation layer 508 receives commands and logical block addresses from the storage client 504 in accordance with this block device interface. As a result, the block I/O emulation layer 508 provides the storage device 102 compatibility with block storage clients 504.

In one embodiment, a storage client 504 communicates with the storage controller 506 through a direct interface layer 510. In this embodiment, the storage device 102 directly exchanges information specific to non-volatile storage devices. A storage device 102 using direct interface 510 may store data on the solid-state storage media 110 as blocks, sectors, pages, logical blocks, logical pages, erase blocks, logical erase blocks, ECC chunks, logical ECC chunks, or in any other format or structure advantageous to the technical characteristics of the solid-state storage media 110. The storage controller 506 receives a logical address and a command from the storage client 504 and performs the corresponding operation in relation to the non-volatile solid-state storage media 110. The storage controller 506 may support a block I/O emulation layer 508, a direct interface 510, or both a block I/O emulation layer 508 and a direct interface 510.

As described above, certain storage devices, while appearing to a storage client 504 to be a block storage device, do not directly associate particular logical block addresses with particular physical blocks, also referred to in the art as sectors. Such storage devices may use a logical-to-physical translation layer 512. The logical-to-physical translation layer 512 provides a level of abstraction between the logical block addresses used by the storage client 504, and the physical block addresses at which the storage controller 506 stores the data. The logical-to-physical translation layer 512 maps logical block addresses to physical block addresses of data stored on solid-state storage media 110. This mapping allows data to be referenced in a logical address space using logical identifiers, such as a logical block address. A logical identifier does not indicate the physical location of data on the solid-state storage media 110, but is an abstract reference to the data.

The storage controller 506 manages the physical block addresses in the physical address space. In one example, contiguous logical block addresses may in fact be stored in non-contiguous physical block addresses as the logical-to-physical translation layer 512 determines the location on the solid-state storage media 110 to perform data operations.

Furthermore, in one embodiment, the logical address space is substantially larger than the physical address space. This "thinly provisioned" or "sparse address space" embodiment, allows the number of logical identifiers for data references to greatly exceed the number of possible physical addresses.

In one embodiment, the logical-to-physical translation layer 512 includes a map or index that maps logical block addresses to physical block addresses. The map may be in the form of a B-tree, a content addressable memory ("CAM"), a binary tree, and/or a hash table, and the like. In certain embodiments, the logical-to-physical translation layer 512 is a tree with nodes that represent logical block addresses and comprise corresponding physical block addresses.

As stated above, in conventional block storage devices, a logical block address maps directly to a particular physical block. When a storage client 504 communicating with the conventional block storage device deletes data for a particular logical block address, the storage client 504 may note that the particular logical block address is deleted and can re-use the physical block associated with that deleted logical block address without the need to perform any other action.

Conversely, when a storage client 504, communicating with a storage controller 104 with a logical-to-physical translation layer 512 (a storage controller 104 that does not map a logical block address directly to a particular physical block), deletes a logical block address, the corresponding physical block address remains allocated because the storage client 504 does not communicate the change in used blocks to the storage controller 506. The storage client 504 may not be configured to communicate changes in used blocks (also referred to herein as "data block usage information"). Because the storage client 504 uses the block I/O emulation 508 layer, the storage client 504 may erroneously believe that the storage controller 506 is a conventional storage controller that would not utilize the data block usage information. Or, in certain embodiments, other software layers between the storage client 504 and the storage controller 506 may fail to pass on data block usage information.

Consequently, the storage controller 104 preserves the relationship between the logical block address and a physical address and the data on the storage device 102 corresponding to the physical block. As the number of allocated blocks increases, the performance of the storage controller 104 may suffer depending on the configuration of the storage controller 104.

Specifically, in certain embodiments, the storage controller 506 is configured to store data sequentially, using an append-only writing process, and use a storage space recovery process that re-uses non-volatile storage media storing deallocated/unused logical blocks. Specifically, as described above, the storage controller 506 may sequentially write data on the solid-state storage media 110 in a log structured format and within one or more physical structures of the storage elements, the data is sequentially stored on the solid-state storage media 110.

As a result of storing data sequentially and using an append-only writing process, the storage controller 506 achieves a high write throughput and a high number of I/O operations per second ("IOPS"). The storage controller 506 includes a storage space recovery, or garbage collection process that re-uses data storage cells to provide sufficient storage capacity. The storage space recovery process reuses storage cells for logical blocks marked as deallocated, invalid, unused, or otherwise designated as available for storage space recovery in the logical-physical translation layer 512.

As described above, the storage space recovery process determines that a particular section of storage may be recovered. Once a section of storage has been marked for recovery, the storage controller 506 may relocate valid blocks in the section. The storage space recovery process, when relocating valid blocks, copies the packets and writes them to another location so that the particular section of storage may be reused as available storage space, typically after an erase operation on the particular section. The storage controller 506 may then use the available storage space to continue sequentially writing data in an append-only fashion. Consequently, the storage controller 104 expends resources and overhead in preserving data in valid blocks. Therefore, physical blocks corresponding to deleted logical blocks may be unnecessarily preserved by the storage controller 104, which expends unnecessary resources in relocating the physical blocks during storage space recovery.

Some storage devices 102 are configured to receive messages or commands notifying the storage device 102 of these unused logical blocks so that the storage device 102 may deallocate the corresponding physical blocks. As used herein, to deallocate a physical block includes marking the physical block as invalid, unused, or otherwise designating the physical block as available for storage space recovery, its contents on storage media no longer needing to be preserved by the storage controller 506. Data block usage information, in reference to the storage controller 506, may also refer to information maintained by the storage controller 506 regarding which physical blocks are allocated and/or deallocated/unallocated and changes in the allocation of physical blocks and/or logical-to-physical block mapping information. Data block usage information, in reference to the storage controller 506, may also refer to information maintained by the storage controller 506 regarding which blocks are in use and which blocks are not in use by a storage client. Use of a block may include storing of data in the block on behalf of the client, reserving the block for use by a client, and the like.

While physical blocks may be deallocated, in certain embodiments, the storage controller 506 may not immediately erase the data on the storage media. An erase operation may be performed later in time. In certain embodiments, the data in a deallocated physical block may be marked as unavailable by the storage controller 506 such that subsequent requests for data in the physical block return a null result or an empty set of data.

One example of a command or message for such deallocation is the "Trim" function of the "Data Set Management" command under the T13 technical committee command set specification maintained by INCITS. A storage device, upon receiving a Trim command, may deallocate physical blocks for logical blocks whose data is no longer needed by the storage client 504. A storage controller 506 that deallocates physical blocks may achieve better performance and increased storage space, especially storage controllers 506 that write data using certain processes and/or use a similar data storage recovery process as that described above.

Consequently, the performance of the storage controller 506 is enhanced as physical blocks are deallocated when they are no longer needed such as through the Trim command or other similar deallocation commands issued to the storage controller 506.

Multi-Level Memory Cell

Figure 6:
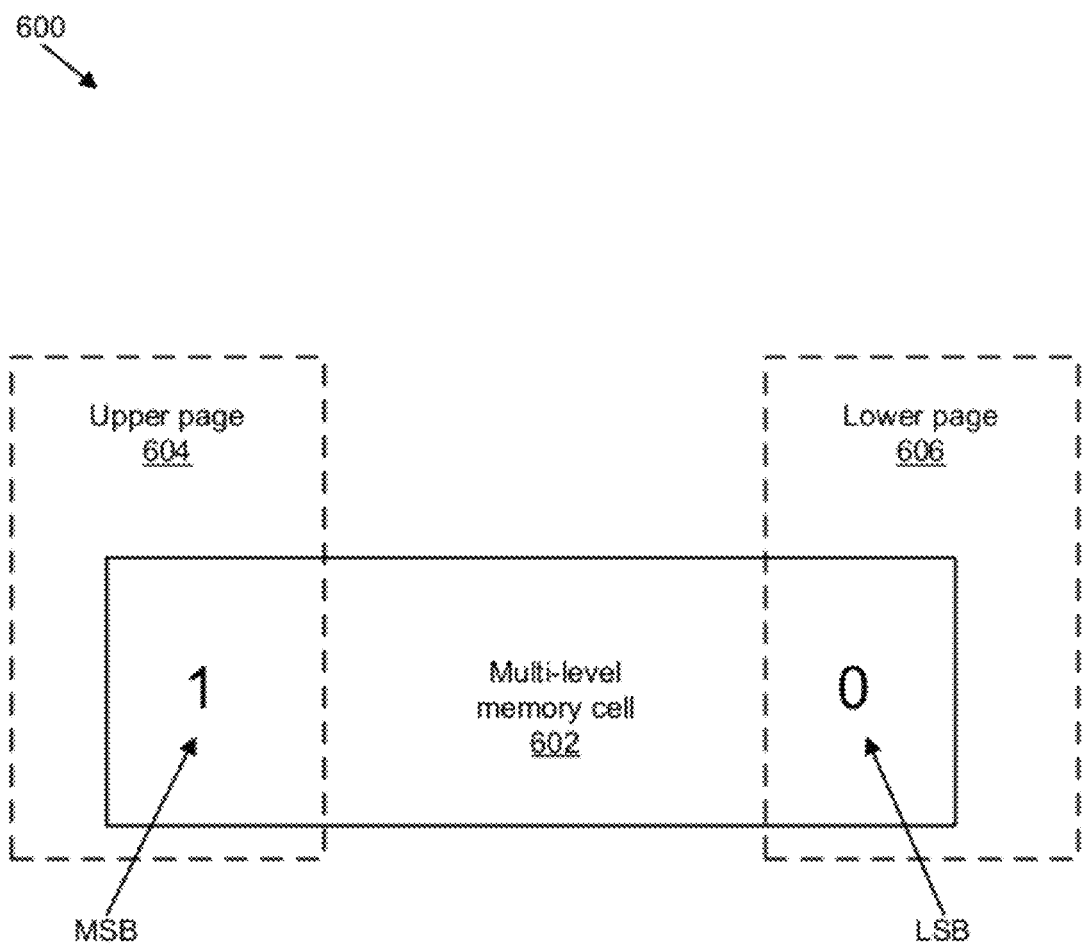
FIG. 6 is a schematic block diagram illustrating one embodiment of a multi-level memory cell.

FIG. 6 shows one representation of a multi-level memory cell 602 in a storage device. As described above, the solid-state storage device 102 may include solid-state storage elements comprising multi-level memory cells ("MLC"). The multi-level memory cell 602 is a cell that has $2^n$ possible states, where n is equal to the number of bits per cell. For example, a multi-level memory cell such as the one shown in FIG. 6 may store 2 bits of information, and accordingly have four possible states, as discussed in greater detail below.

The multi-level memory cell 602 stores at least a most significant bit (MSB) and a least significant bit (LSB). In certain embodiments, as shown in FIG. 6, the MSB and the LSB, though part of the same physical multi-level memory cell 602, may be assigned to different pages of the media. In certain embodiments, a plurality of the multi-level memory cells 602 are organized on the solid-state storage media (such as NAND flash for example) as a page. In certain solid-state storage media comprising a plurality of the multi-level memory cells 602 a page is the smallest unit that can be written to the media. In such embodiments, the multi-level memory cell 602 may be associated with a page pair. A page pair is a pair of pages (upper and lower) that are associated with a single set of physical multi-level memory cells. For example, in FIG. 6, the multi-level memory cell 602 is associated with the page pair that includes the upper page 604 and the lower page 606. The upper page 604 is associated with the MSB, and the lower page 606 is associated with the LSB.

Thus, the MSB and LSB in the same multi-level memory cell 602 may have different addresses in the storage device. In certain embodiments, the upper page 604 includes the MSBs of a plurality of multi-level memory cells 602, and the lower page 606 includes the LSBs of the same multi-level memory cells 602. Writes directed to the upper page 604 may therefore cause changes only in the MSBs of the associated multi-level memory cells 602, while writes directed to the lower page 606 cause changes only in the LSBs of the associated multi-level memory cells 602. For multi-level memory cells such as NAND flash, writes directed to an upper page 604 or a lower page 606 may cause changes to only certain of the associated multi-level memory cells 602, since an erase operation puts the multi-level memory cells 602 in a first logic value state, and the write operation or program operation only change certain multi-level memory cells 602 to the opposite logic value state. Similarly, reads of data stored in the upper page 604 cause reads of the MSBs of multiple multi-level memory cells 602, and reads of data stored in the lower page 606 cause reads of the LSBs of multiple multi-level memory cells 602.

In certain embodiments, the multi-level memory cell 602 may store a data bit in one of the LSB and/or the MSB. A data bit is valid if it has retained the value written to it during a previous successful write operation. In certain embodiments, there may be additional bits stored in the multi-level memory cells. For example, certain multi-level memory cells may support three or more bits. In such embodiments, the bits that are not the MSB nor the LSB may be apportioned to act as data bits depending on the needs of the storage system.

In certain embodiments, the data bits are read in response to requests for data that has been stored on the storage device. Such a request may be referenced as a first read operation. In certain embodiments, the first read operation is directed to the lower page 606 such that only the LSB is returned from the multi-level memory cell 602. For example, a client (such as a file system software application, operating system application, database management systems software application, a client computer, a client device, or the like) may store data on a storage device. In this example, when the client sends a write request, the data is written exclusively to the lower page 606. As a result, the LSBs in the various multi-level memory cells 602 are changed, but the MSBs are not changed by the write. Similarly, in this example, when the client reads data, the read is directed or addressed to the lower page 606 and only the LSBs associated with the lower page 606 are read.

Writing data exclusively to the lower page 606 may reduce the capacity of the solid state storage media, but increase the reliability of the storage device. For example, as described further below, writing exclusively to the lower page may place less stress on the individual multi-level memory cells and thereby reduce instances of failure in the storage device. In addition, the manufacturer and consumer may take advantage of the lower cost of MLC media while getting performance comparable to SLC media. Furthermore, in embodiments which use a mapping logic module described below to handle mapping the pages, the manufacturer can easily substitute between MLC and SLC media for the storage device without having to make major redesigns each time.

Figure 7:
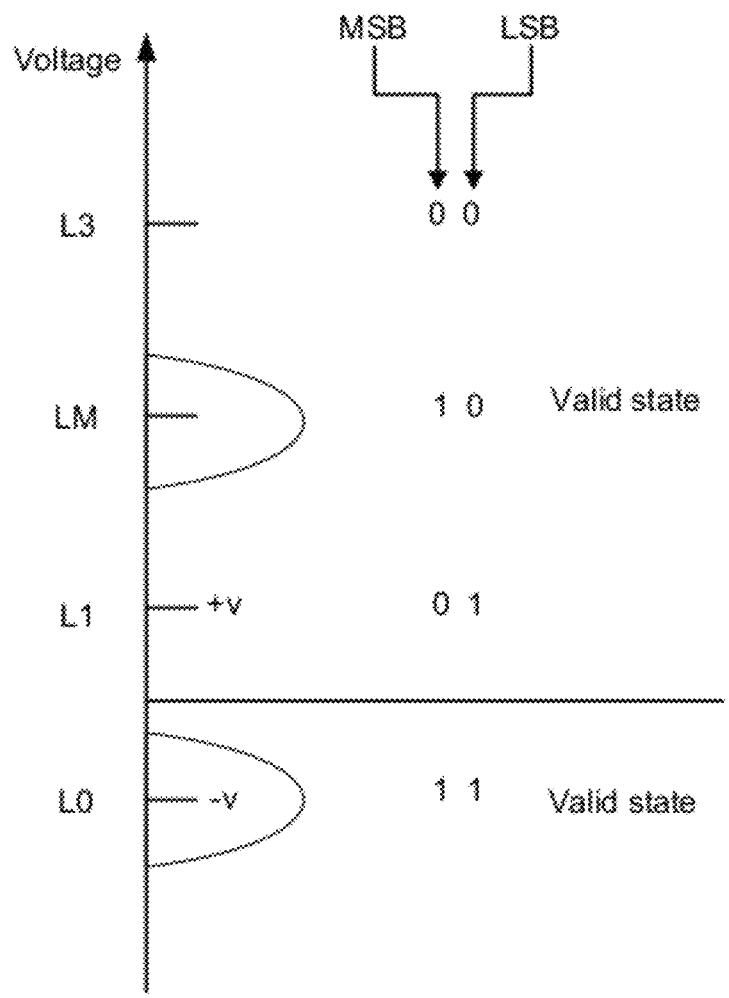
FIG. 7 is a schematic block diagram illustrating one embodiment of voltage levels in a multi-level memory cell and an associated programming model.

FIG. 7 shows one embodiment of a programming model for a multi-level memory cell such as the multi-level memory cell 602. Certain aspects of the foregoing discussion may be applicable only to those multi-level memory cells 602 having the represented programming model. Other aspects are generally applicable. Any limitations inherent in the represented programming model do not necessarily apply to all other programming models, and the present invention should not be construed as inherently containing any such limitations.

FIG. 7 shows that the value "11" is associated with the lowest voltage state (labeled L0) which may comprise a negative voltage, the value "00" is associated with the highest voltage state (labeled L3), and "10" and "01" are associated with intermediate states LM and L1 respectively. The storage device interprets the four discrete levels of voltage stored in the multi-level memory cell 602 as representing two binary bits, a most significant bit and a least significant bit. As explained above, other programming models may be used. Also, certain storage devices may have more than four possible states, allowing more than two binary values to be stored in a single multi-level memory cell 602. The voltage levels L0, L1, LM, and L3 may or may not be contiguous; for example, in certain embodiments, the voltage levels are separated by band gaps known as guard band. For example, L0 and L1 may be separated by 0.3V. In certain embodiments discussed below, unused levels may be used to increase the guard band as shown in FIG. 7. The x-axis represents a number of cells that have the voltage level indicated on the y-axis. It should be noted that FIG. 7 is not intended to show all possible states that cells in an MLC cell array can be programmed to. (see FIG. 8 for such examples)

In one embodiment, the LSB corresponds to the lower page 606 and the MSB corresponds to the upper page 604. In certain embodiments, data sent to the storage device to be stored thereon is only stored in the LSB, and the MSB is unused. In certain embodiments, the expected value for the MSB is a "1." In such an embodiment, the valid states for the multi-level memory cell 602 are at L0 (when the data bit should store a 1) and LM (when the data bit should store a 0) (SMLC). In certain embodiments, the expected value for the MSB is selected to be the binary value that the MSB will be given after the multi-level memory cell 602 has been erased and is ready for programming. For example, all bits in the multi-level memory cell 602 may be set to binary 1 after they are erased. In such embodiments, the MSB is therefore expected to be a 1, and writes to the data bit are executed such that the MSB value does not change from 1. To again reference FIG. 7, L0 and LM correspond to such states.

For example, in FIG. 7, the multi-level memory cell 402 may be placed in L0 after an erase operation. L0 is thus the valid state when the data bit (LSB) contains a 1. If the data bit (LSB) is changed to a 0, the program operation changes the state from L0 to LM, which changes the value of the data (assuming the LSB is the data bit) but does not change the value of the MSB.

In certain embodiments, discussed below, the multi-level memory cell 602 may adhere to a two-phase programming model, which requires that the LSB be written to before the MSB can be written. In such a two-phase programming model, choosing to write data only to the LSB as in embodiments of the present invention means that the individual multi-level memory cells 602 could not move into state L1. Writing only to the LSB can be accomplished by skipping and not programming the MSB.

In certain embodiments, as shown in FIG. 7, certain states are not used to store data; rather, they are unused and thereby provide additional guard band to enhance data retention. For example, in FIG. 7, L0 is a valid state and LM is a valid state. By transitioning from L0 to LM, state L1 can be considered additional guard band. This may be in addition to guard band already built into the storage device; for example, there may be a 0.3V separation between L1 and L0, which acts as a guard band between those two states.

In certain embodiments, the valid states are selected such that all valid states are less than the highest supported state in the multi-level memory cell 602. Such a configuration may be useful in extending the life of the storage device by reducing the stress placed on the individual multi-level memory cells 602 that occurs when the cells are pushed to the maximum supported voltage level. Such an embodiment may further reduce the risk of overshooting the maximum supported voltage level and damaging the multi-level memory cell 602.

The guard bands represent a difference in voltage levels that protect the data bit from drift caused by leakage or disturbances described above. A larger guard band may facilitate better data retention by allowing more drift without altering the binary state of the data bit stored in the cell. In the example shown in FIG. 7, if the multi-level memory cell has been programmed to the L0 level, and the voltage in the multi-level memory cell 402 unintentionally drifts up into the L1 level, the data bit (represented in the LSB) will not register as an error, or as invalid (since it remains at a 1). Thus, reads of the lower page 606 will not return an error at the bit associated with this particular multi-level memory cell 602.

If the multi-level memory cell 602 is deemed unreliable, multi-level memory cell 602 may be marked as such. Alternatively, the storage device may take the multi-level memory cell 602 out of service by adjusting an address mapping to make the multi-level memory cell 602 un-addressable. In response to determining that the multi-level memory cell is unreliable, the storage device may retire the multi-level memory cell 602, configure the multi-level memory cell 602 to store only a single bit, or take other action that may be appropriate. Such action may occur on a larger scale than a single multi-level memory cell 602; for example, retirement and reconfiguration or remapping may occur at the erase block level, or the like.

In certain embodiments, the storage device may reconfigure a multi-level memory cell 602 to store only a single bit when the multi-level memory cell 602 loses its ability to accurately store and differentiate between all of the levels that the multi-level memory cell 602 was originally designed to support. For example, the storage device may be configured to use the multi-level memory cells 602 to store only a single bit. In one embodiment, the storage device may configure the device to store a 1 at level L0, and a 0 at L3. In such a configuration, the storage device may interpret data stored at either L3 or LM as a 0, and data stored at either L0 or L1 to be a 1. In this manner, the life of the storage device may be extended. In addition, this may improve data retention due to an increase in the guard band between the two valid states. In certain embodiments of such a configuration, only one of the two bits is given any value. For example, in FIG. 7, only the LSB may be read or written. The MSB (and the associated pages) may be retired and unused.

In certain embodiments, the LSB and MSB are programmed separately by the storage device. Such an approach may be taken due to vendor requirements for page pairing (i.e., a LSB bit of MLC cell is paired with an MSB bit of a different MLC cell) and page addressing (i.e., LSB page must be programmed before the MSB page). In certain instances, the LSB must be written before the MSB is written. In such embodiments, the delay associated with writing to the MSB may be at least five times greater than the delay associated with writing data to the LSB. In such instances, embodiments of the present invention write data exclusively to the LSB. Such embodiments may write no data to the MSB. Instead, such embodiments may rely on the fact that the media hardware controller sets the expected value automatically as part of the preparation of the media for data storage (i.e. certain solid-state storage devices such as NAND flash must be erased before they can be programmed).

In certain embodiments, the storage device may employ a two-phase programming model. In such a model, a logical value is first written to the LSB by way of a first write command to the lower page 606. In addition, certain solid-state media vendors may impose a requirement that the lower page 606 must be written to before the upper page 604.

While many embodiments are described herein, at least some of the described embodiments implement a Single-mode Multi-Level Cell (SMLC) mode in which an MLC memory device is operated as if it was a single-level cell (SLC). The SMLC mode restricts the number of programming states to which each MLC memory element may be programmed. In a specific embodiment, the SMLC mode restricts each MLC memory element to be programmed in either an erase state or a state, which is closest to a natural threshold voltage of the MLC memory element. When a memory cell is operated in SMLC mode, the memory cell may have less data storage capacity. For example, a two-bit MLC cell capable of storing two bits when operated in MLC mode may store only one bit when operated in SMLC mode. However, the memory cell may operate more reliably or may exhibit more desirable retention characteristics when in SMLC mode as compared with operating the memory cell in MLC mode. Accordingly, SMLC mode may trade capacity for reliability.

Figure 8A:
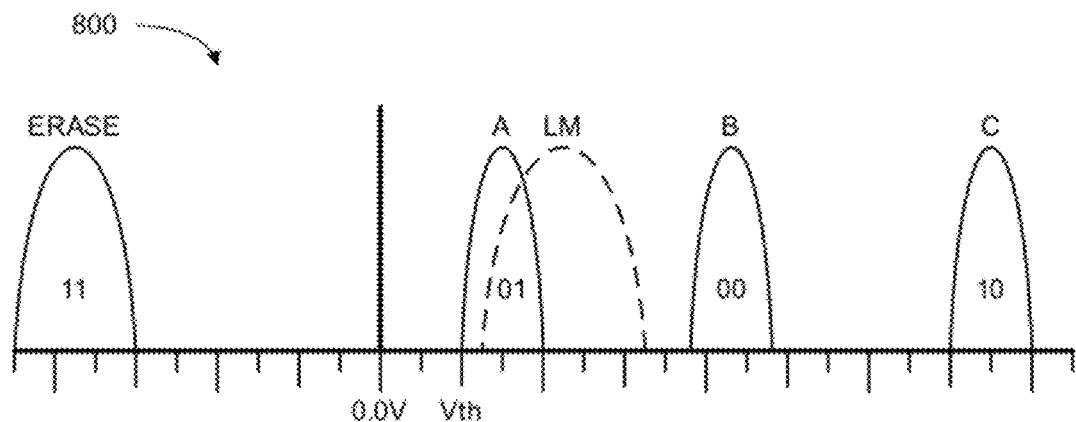
FIG. 8A is a schematic block diagram illustrating another embodiment of voltage levels in a multi-level memory cell and an associated programming model.

FIG. 8A illustrates a graphical diagram 800 of various programming states of a programming model that may be used in conjunction with a MLC mode. Each programming state includes a range of voltages, which correspond to the horizontal axis. The vertical axis corresponds to zero volts. Voltages to the left are negative voltages, and voltages to the right are positive voltages. Other conventions may be used to designate the voltages.

The natural threshold voltage, Vth (also designated as Vth), of the memory element is also identified. The natural threshold voltage of the memory element refers to a specific or approximate voltage level of the floating gate within the memory element. The natural threshold voltage is the voltage read from a newly manufactured memory element prior to executing an initial erase operation or write operation on the memory element. In this newly manufactured state, there are no electrons on the floating gate of the memory element besides those that naturally exist in the floating gate material. In some embodiments, the natural threshold voltage is about 0.5V and can range between about 0.1V and about 0.6V, although other embodiments may have a different natural threshold voltage. The natural threshold voltage generally correlates with a value approximately at which an inversion layer is formed in the substrate of the memory element. For example, if the natural threshold voltage is about 0.5V, then the inversion layer may be formed having a gate bias of at 0.6V or higher voltages.

The programming states include four designated programming states ERASE, A, B, and C (shown with solid lines) and one intermediate state (shown with dashed lines). The solid lines represent a statistical distribution of voltages for a set of cells of a given state once a programming operation is completed. Solid lines for ERASE, A, B, and C states represent the possible states cells can take on when multiple bits of a MLC cell are programmed. In the illustrated example, the statistical distribution of voltages corresponding to the ERASE state spans from about −2.25V to about −1.5V. The statistical distribution of voltages corresponding to each of the other programming states span a range of about 0.5V—state A spans from about 0.5V to about 1.0V; state B spans from about 1.85V to about 2.35V; and state C spans from about 3.5V to about 4.0V. In other embodiments, the spans may be different and may start or end at different voltages.

The intermediate state also may be referred to as the low to middle (LM) state because it is between the state A and the state B. In the illustrated embodiment, the intermediate LM state spans from about 0.7V to about 1.6V, although other embodiments may use other statistical distribution of voltages for the intermediate LM state.

The term "designated programming states" is used herein to refer to the group of all states which are available for programming based on a manufacturer's design and implementation. For example, FIG. 8A includes at least four designated programming states (ERASE, A, B, and C), each of which is operational to maintain a programming state corresponding to a value for a bit (or values for multiple bits) of data. In some embodiments, an LM state serves as a fifth designated programming state, for maintaining a programming state corresponding to one or more bit values. In certain embodiments, the LM state is used when a cell has the LSB programmed and the MSB has not yet been programmed. Cells with an LSB programmed have voltages either in state ERASE or LM. Once cells in an LM state are programmed they move to either state B or C.

In the illustrated embodiment, the designated programming states ERASE and A-C represent bit combinations 11, 01, 00, and 10 (from the lowest voltage range to the highest voltage range). In this convention, the left bit is the most significant bit (MSB), and the right bit is the least significant bit (LSB). The intermediate state is designated as 10 in the intermediate LM state to indicate that the LSB is set to zero, but the MSB is not yet set to a specific bit value.

In operation, the designated programming state that represents the bit combination 11 is also designated as the erase state. When the MLC memory elements are erased, by default each MLC memory element is returned to the erase state, which represents the bit combination 11. In order to program the MLC memory element, the MLC memory element is either left in the default erase state (to represent a logical 0) or programmed to the intermediate LM state (to represent a logical 1).

Once the LSB is programmed, then the MSB may be programmed. If the LSB is 1 and the MSB is supposed to be 1, then the MLC memory element is maintained in the erase state, because the erase state corresponds to the bit combination 11. If the LSB is 1 and the MSB is supposed to be 0, then the MLC memory element is programmed to the state A corresponding to 01. If the LSB is programmed to 0, and the MSB is supposed to be 0, then the MLC memory element is programmed to the state B corresponding to 00. If the LSB is programmed to 0, and the MSB is supposed to be 1, then the MLC memory element is programmed to the state C corresponding to 10. This is just one example of bit combinations that may be assigned to the various programming states, according to a gray code programming model. Other embodiments may use other bit combinations assigned to the various programming states.

The MLC memory element is programmed in two or more phases. Programming the LSB is a first phase that places the MLC memory element in the erase state or the LM state. If all the pages of the MLC memory element are programmed using the multi-phase programming model, then certain cells may be programmed to transition from the LM state to either state B or state C, other cells may be programmed to transition from the erase state to state A, depending on the values that are programmed. This may be referred to as two-phase programming, because the programming is performed to the intermediate LM state in a first phase and then programmed to one of the states B or C in a second phase.

The intermediate LM state is used to program pages of the MLC memory element that use the LSB. Using an intermediate LM state allows pages using the LSB to be programmed while pages that use the MSB are not programmed and allows the state of a cell to take one of the states Erase, A, B, or C when two or more pages that include the cell are programmed. In contrast, if pages for the MSB of the MLC memory element are programmed then only states Erase and state A are used, as a result the intermediate LM state is not used.

Figure 8B:
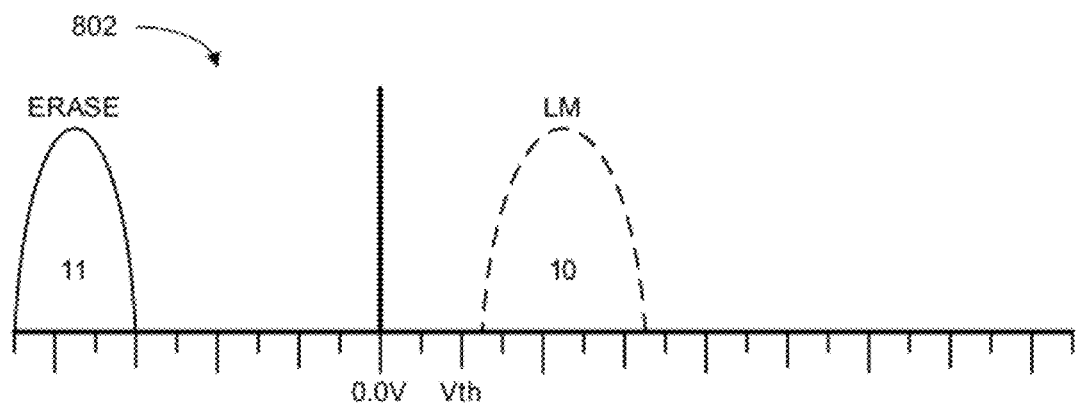
FIG. 8B is a schematic block diagram illustrating another embodiment of voltage levels in a multi-level memory cell and an associated programming model.

FIG. 8B illustrates a graphical diagram 802 of programming states of one embodiment of a programming model which uses the LSB (the lower page) when in SMLC mode. In this programming mode, the value of the MSB may be irrelevant. The MLC memory element may be programmed to the erase state to represent a bit value of 1, or to the intermediate LM state to represent a bit value of 0. Since the programming model illustrated in FIG. 8B only uses a subset of the designated programming states for representing bit values, these programming states are referred to herein as "restricted programming states." In general, restricted programming states include some, but not all, (i.e., an exclusive subset) of the designated programming states. In contrast, in this embodiment, the A, B, and C states of FIG. 8A are not used for any bit value representations, so the A, B and C states are not designated as restricted programming states.

Referring back to FIG. 8A, in one embodiment, the restricted programming states comprise states ERASE and C. Such an embodiment may be advantageous where the storage media is a non-volatile storage media that does not have a natural threshold voltage such as a phase change memory and the like. In such an embodiment, use of states separated such as ERASE and C allow for more variation in the distribution of cells that are in each of the states.

Figure 8C:
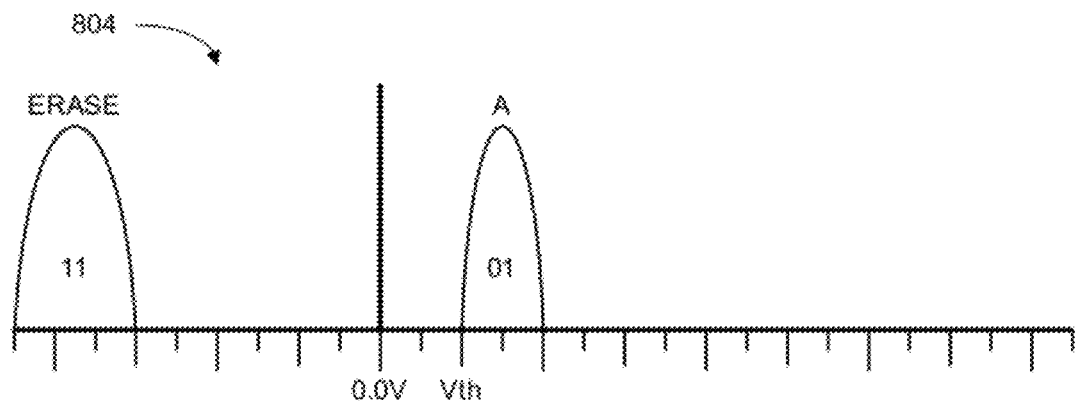
FIG. 8C is a schematic block diagram illustrating another embodiment of voltage levels in a multi-level memory cell and an associated programming model.

FIG. 8C illustrates a graphical diagram 804 of programming states of one embodiment of a programming model, which uses the MSB (upper page) for the SMLC mode. In this programming mode, the value of the LSB remains 1. The MLC memory element may be programmed to the erase state to represent a bit value of 1 (a logical "0"), or to the state A to represent a bit value of 0 (a logical "1"). For reference, the state A represents the state that is closest to the threshold voltage Vth of the MLC memory element. Also, since the programming model illustrated in FIG. 8C only uses a subset (i.e., ERASE and A states) of the designated programming states for representing bit values, these programming states are referred to herein as "restricted programming states."

In some embodiments, by utilizing the state that is closest to the threshold voltage Vth of the MLC memory element for the SMLC mode, the accuracy of the MLC device is maintained longer compared with using the MLC device in a MLC mode or using the MLC device in the SMLC mode based on programming only pages that use the LSB. In this way, the longevity of the MLC device can be extended, because there is less programming voltage used to program the MLC memory elements to the lower voltage programming state.

Additionally, in some embodiments it is relatively unlikely that the MLC memory element might get overprogrammed relative to state A. In fact, even if the MLC memory element is overprogrammed relative to state A, the value of the MSB does not necessarily change between the states A and B, using the convention shown in FIG. 8C.

Also, in certain embodiments, this approach using the MSB state for the SMLC mode may take about the same amount of time to program the MLC memory element than using only the LSB state. Reading from MLC memory element that have only the MSB state programmed may take a little longer since the MLC memory element may perform two or more reads to verify that the cell voltage is within the erase state or the A state. Additionally, this approach results in the creation of less electron trapping sites within the gate of the MLC memory elements due to the lower programming voltage applied, which contributes to the longevity of the MLC memory elements. In some embodiments, using the MSB only in NAND MLC reduces the amount of trapping charges due to program/erase (P/E) cycling by lowering the voltage swing. If there are less trapped charges and/or trap sites, then there is low trap-assisted tunneling and path through a string of traps. Consequently, this also makes it less likely that the MLC memory element might be overprogrammed relative to state A. Moreover, there is very little voltage (Vt) drift of state A because the Vt level of state A is relatively close to the natural Vt level of the MLC memory element. This possibility of overprogramming typically increases with the age of the MLC device.

ECC Encoding

Figure 9:
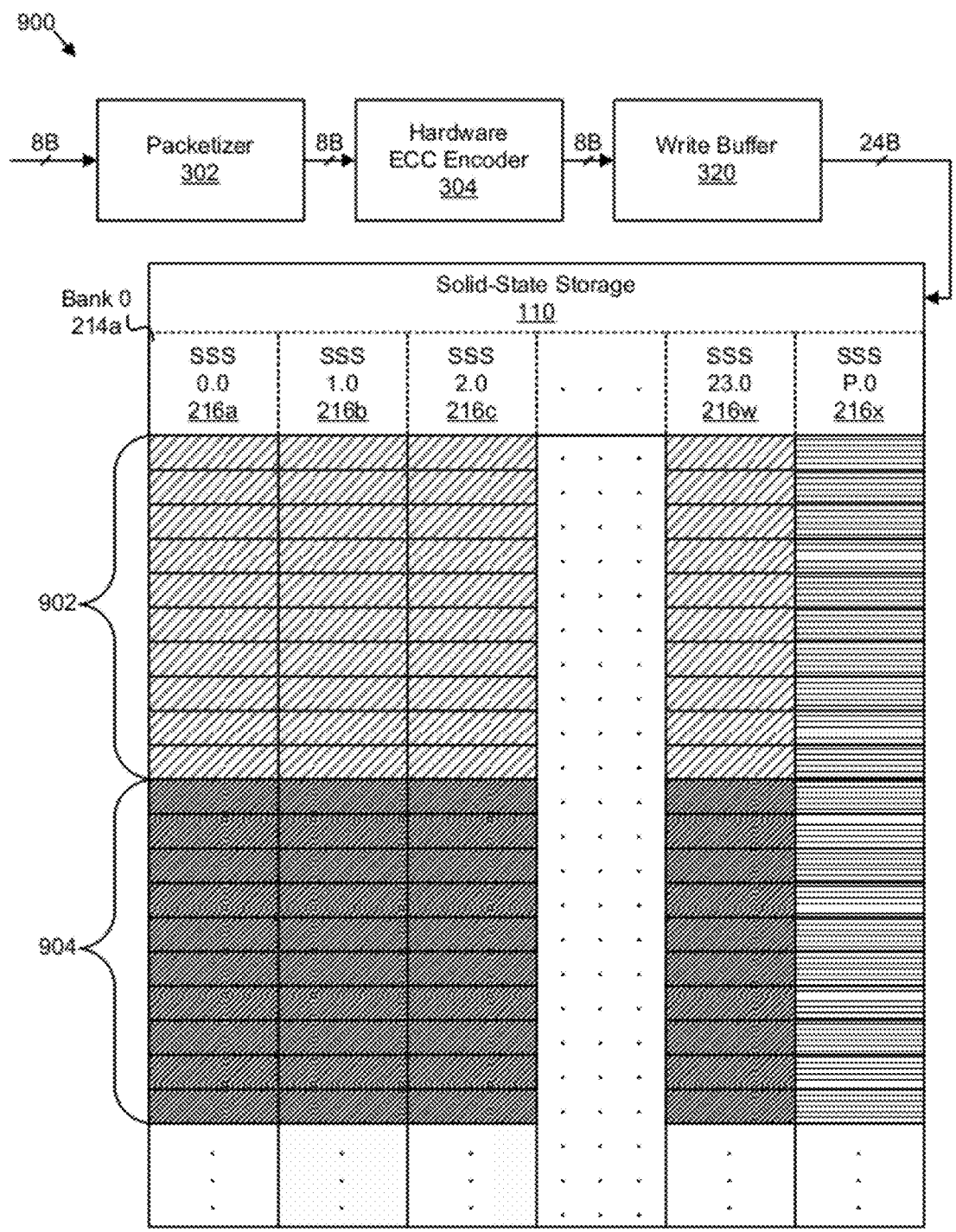
FIG. 9 is a schematic block diagram illustrating one embodiment of a system for ECC encoding in accordance with the present invention.

FIG. 9 depicts one embodiment of a system 900 for ECC encoding. The system 900, in the depicted embodiment, includes the packetizer 302, the hardware ECC encoder 304, the write buffer 320, and the solid-state storage media 110. The packetizer 302, the hardware ECC encoder 304, the write buffer 320, and the solid-state storage media 110, in one embodiment, are substantially similar to the packetizer 302, the hardware ECC encoder 304, the write buffer 320, and the solid-state storage media 110 described above. As described above with regard to the packetizer 302 of FIG. 3, in one embodiment, the write data pipeline 106 (and the system 900) does not include a packetizer, and the hardware ECC encoder 304 may encode write data directly into ECC codewords. In one embodiment, in place of the solid-state storage media 110, the system 900 includes a different type of data storage media, such as RAM, a hard disk drive, an optical drive, or other data storage media.

In the depicted embodiment, the packetizer 302 receives a stream of write data. The stream of write data, in the depicted embodiment, is an 8 byte (64 bit) stream. The packetizer 302, in one embodiment, packages the write data into packets. For example, in one embodiment, the packetizer 302 packages the write data into 520 byte packets, with 512 bytes of write data and 8 byte headers. In certain embodiments, the size of the packets is configurable by the storage controller 104, the user, the host device 114, or the like. The hardware ECC encoder 304, in the depicted embodiment, receives packets from the packetizer 302, determines ECC data for the packets, and packages the packets into ECC codewords. In one embodiment, the size of an ECC codeword is independent of a size of a packet. For example, the hardware ECC encoder 304 may package a plurality of packets into a single ECC codeword, break a single packet into a plurality of ECC codewords, or the like.

In one example embodiment, (N, K, T)=(1,913, 1,792, 11) and the hardware ECC encoder 304 packages packets into codewords of 240 bytes (N=1,913 bits+7 padding bits) with 224 byte (K=1,792 bit) messages and 121 bits of ECC data (N−K=121 bits). In another example embodiment, (N, K, T)=(7,675, 7,168, 39) and the hardware ECC encoder 304 packages packets into codewords of 960 bytes (N=7,675 bits+5 padding bits) with 896 byte (K=7,168 bit) messages and 507 bits of ECC data (N−K=507 bits). In an additional example embodiment, (N, K, T)=(35,320, 32,776, 159), and the hardware ECC encoder 304 packages packets into codewords of 4,415 bytes (N=35,320 bits) with 4,097 byte (K=32,776 bit) messages and 318 bytes of ECC data (N−K=2,544 bits). One of skill in the art, in view of this disclosure, will recognize other values for N, K, and T based on selected ECC algorithms and other ECC characteristics.

The hardware ECC encoder 304, in the depicted embodiment, sends ECC codewords to the write buffer 320. The write buffer 320, in one embodiment, is sized to fit at least one ECC codeword. In a further embodiment, the write buffer 320 is sized to fit at least one page (or logical page) of data. In another embodiment, the write buffer 320 is sized to fit at least two pages (or logical pages) of data. The write buffer 320, in the depicted embodiment, writes buffered ECC codewords to an array of solid-state storage media 110. In a further embodiment, the write buffer 320 writes buffered ECC codewords to a different type of data storage media.

The array of solid-state storage media 110, in the depicted embodiment, includes 25 solid-state storage elements 216. The solid-state storage elements 216, in various embodiments, may include solid-state storage dies, chips, or the like, as described above with regard to FIG. 2. The first 24 solid-state storage elements 216a-w, in the depicted embodiment, store data of ECC codewords 902, 904. The 25th solid-state storage element 216x, in the depicted embodiment, stores parity data generated from the data of the ECC codewords 902, 904. The solid-state storage element 216x storing parity data, in one embodiment, is a dedicated parity storage element 216x that stores parity data. In a further embodiment, parity data may be rotated among the solid-state storage elements 216.

In one embodiment, each depicted row of a single solid-state storage element 216 represents one byte. The parity data on a single row (for example one byte) of a parity storage element 216x may comprise the parity data for all the bytes of the same row of the first 24 solid-state storage elements 216a-w. In one embodiment, an ECC codeword size is selected such that codewords substantially fit evenly within pages, logical pages, or other boundaries of the solid-state storage media 110. For example, in one embodiment, an ECC codeword size is selected that has a 24-byte alignment.

In the depicted embodiment, for example, the first ECC codeword 902 and the second ECC codeword 904 are each 240 bytes long, with 10 bytes of each codeword 902, 904 stored on each of the first 24 solid-state storage elements 216a-w. In a further embodiment, an ECC codeword size is selected that does not align with a boundary of the solid-state storage media 110, and codewords span storage element boundaries, such as a codeword that does not have a 24 byte alignment.

In one embodiment, one or more ECC codewords are stored across page boundaries. In a further embodiment, ECC codewords are not stored across page boundaries, and one or more extra bytes of a page may be left empty if ECC codewords do not fill a page. For example, if each of the solid-state storage elements 216 comprises a die page with a capacity of 2 kilobytes (2048 bytes), then each solid-state storage element 216, in one embodiment, stores 10 bytes from each of 204 different ECC codewords and 8 bytes are left over in each solid-state storage element 216.

Wordline Architecture

Figure 10:
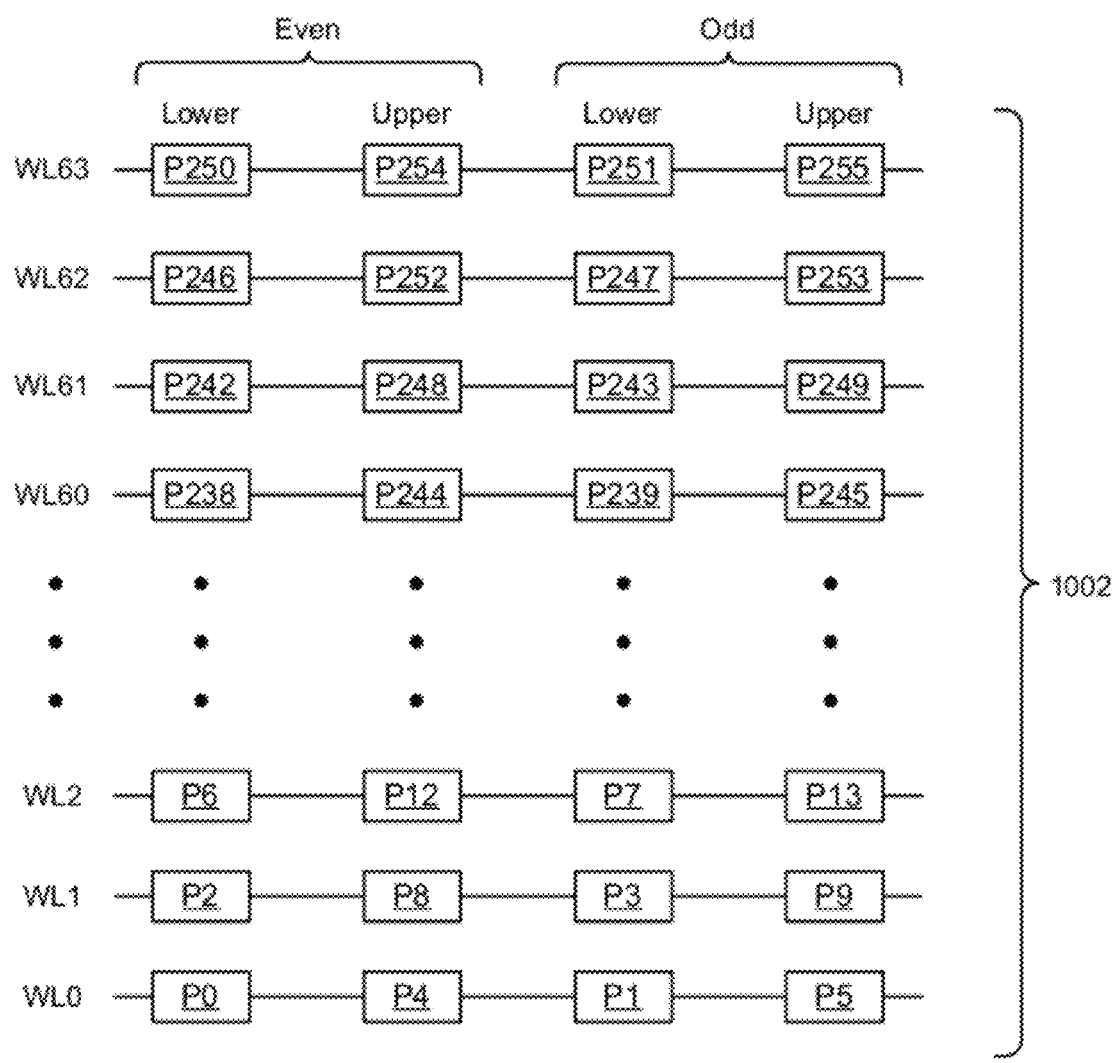
FIG. 10 is a schematic block diagram illustrating relationships between pages, wordlines, and an erase block of a solid-state storage element in accordance with the present invention.

Many different solid-state storage element (e.g., NAND flash device) architectures are possible. In some devices, even and odd pages share the same physical wordline, typically on alternating bit strings. Other devices may have an All Bit Line ("ABL") architecture in which no such even and odd sharing may occur. With MLC devices, pairs of upper and lower pages may share the same set of cells. These are referred to as the Least Significant Bit ("LSB") (lower) and Most Significant Bit ("MSB") (upper) pages, and may be referred to as paired-pages, as described above in relation to FIG. 6. Therefore, for example, as illustrated in FIG. 10, there are four MLC pages on any given wordline. Other devices, such as ABL devices may have two MLC pages on any given wordline. A wordline may include a plurality of (storage cell) pages. For example, a wordline may include 2 pages, 4 pages, 6 pages, and the like. Furthermore, an erase block may include a plurality of wordlines. In certain embodiments, each erase block may include 64 or 128 wordlines, and if there are four pages per wordline, 256 or 512 pages.

Referring to FIG. 10, an erase block 1002 comprising a set of pages P0-P255 is illustrated. Pages P0-P255 are associated with word lines WL0-WL63 as illustrated. The page numbers P0-P255 represent a page programming order. In certain embodiments, the page programming order is sequential. When programming erase block 1002, the pages of an erase block 1002 are programmed in order from lowest to highest (e.g., P0, P1, P2, . . . , P255). Notice that as a result of the way the pages are assigned to the word lines, the word lines are not programmed in a monotonically increasing sequence (one example is due to page interleaving). For example, P0 of WL0 is programmed first, then P1 of WL0, then P2 of WL1, and so on as indicated by the page numbers of FIG. 10.

As illustrated in FIG. 10, each word line is associated with four pages. This is one example of an erase block structure. Other arrangements are also possible. The pages of the erase block 1002 comprise MLC memory cells. Accordingly, some of the pages are lower pages (e.g., P0, P2, P6, P1, P3, P7, . . . ) and some of the pages are upper pages (e.g., P4, P8, P12, P5, P9, P13, . . . ). Furthermore, some of the pages are even pages and some of the pages are odd pages. Thus, one word line may be associated with even pages, odd pages, lower pages, and upper pages.

As a result of the page programming order, the pages of erase block 1002 are generally program from bottom to top. As was described above, typically, an entire page is programmed at a time, an entire page is read at a time, and all pages of erase block 1002 are erased at the same time. A P/E cycle includes erasing erase block 1002 then programming one page at a time starting with P0 and ending with P255. Once page P255 has been programmed, the data stored by erase block 1002 is fixed until the entire erase block is erased. As was described above in relation to solid-state storage 110, a plurality of erase blocks (such as erase block 1002) together make up a logical erase block and the storage controller 506 may program or erase the erase blocks of the logical erase block in parallel.

As was described above in relation to FIG. 8, some or all MLC cells of erase block 1002 may be programmed in SMLC mode. For example, the cells associated with WL63 may be programmed in SMLC mode such that user data is programmed in lower pages P250 and P251, but not in upper pages P254 and P255. Alternatively, user data may be programmed in upper pages P254 and P255 but not in lower pages P250 and P251.

Wordline Retention

Studies have shown, in a high temperature retention test for 3×nm MLC storage media, the bit error count increases dramatically by about eight times in the last few pages of an erase block. The number of errors is exacerbated when the wear-out level is high, e.g., 15 k P/E (Program/Erase) cycles, and baking time is long, e.g., 70 C/63 hours.

Figure 11:
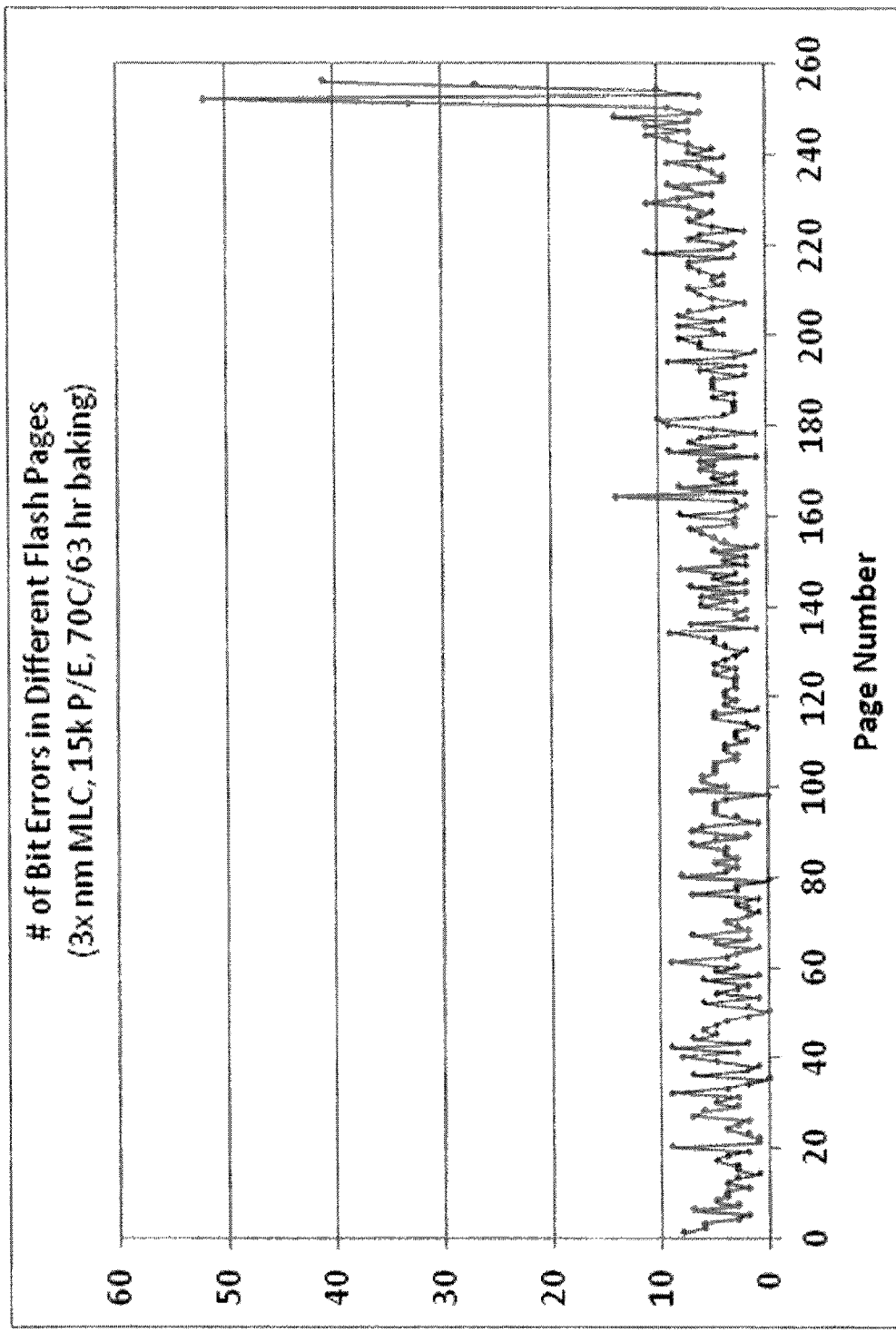
FIG. 11 is a chart illustrating bit errors per page in an erase block of a solid-state storage element resulting from one set of conditions in accordance with the present invention.
Figure 12:
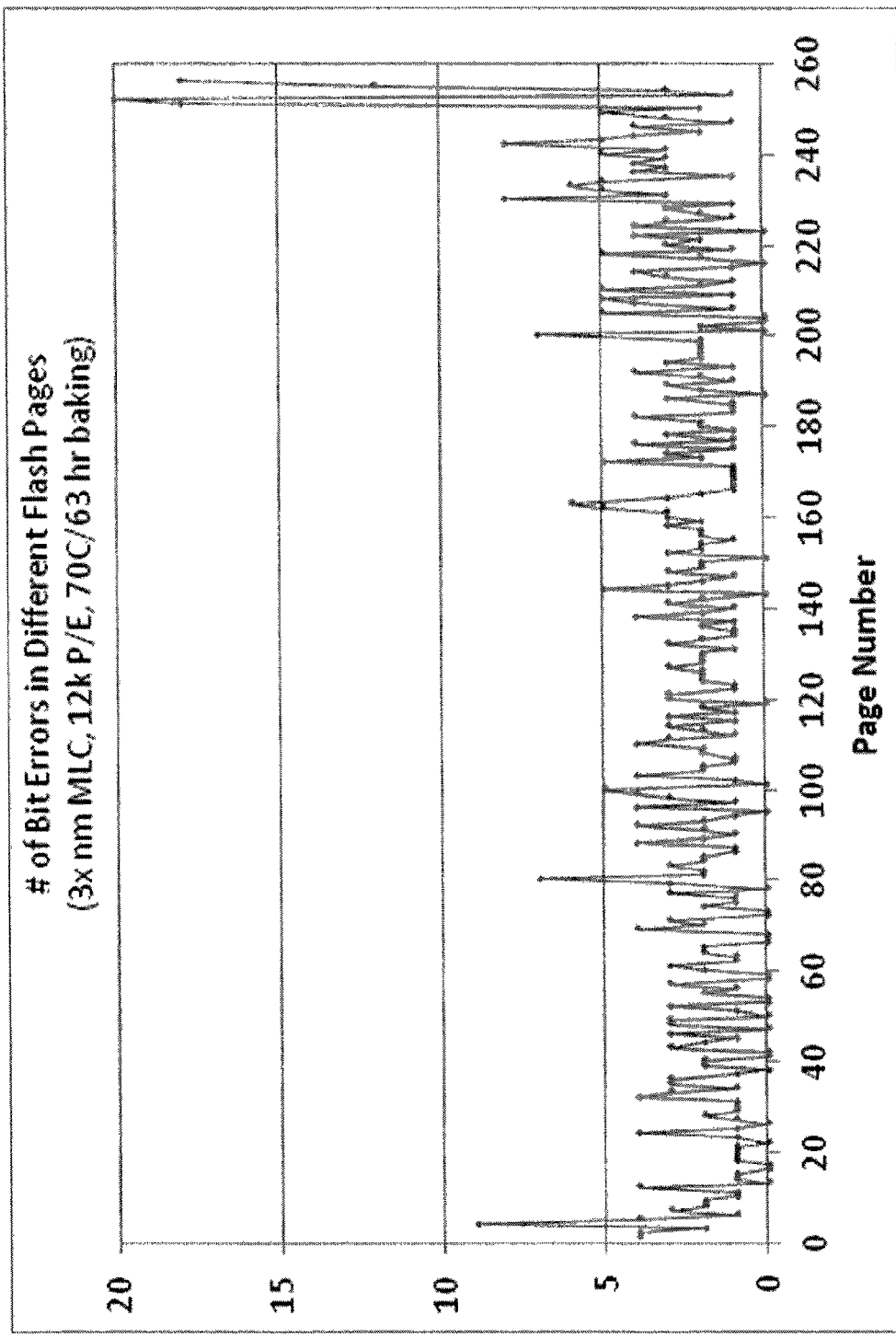
FIG. 12 is a chart illustrating bit errors per page in an erase block of a solid-state storage element resulting from another set of conditions in accordance with the present invention.

FIGS. 11 and 12 illustrate the number of bit errors per page for 3×nm MLC, with 70 C/63 hour baking and 15 k P/E cycles, and 12 k P/E cycles respectively. The data collected in FIGS. 11 and 12 are from two different boards to mitigate the possibility of a board-specific problem. The phenomenon illustrated in FIGS. 11 and 12 has been observed across many different boards, dies, and erase blocks. Note that pages 250, 251, 254 and 255 (which are all associated with wordline 63) have about eight times more bit errors than the other pages of the erase block.

In some cases, this wordline vulnerability results from the page programming order of conventional NAND Flash, which results in memory cells of pages of the last programmed wordline experiencing less program disturb (e.g., floating gate coupling effect) than other wordlines of an erase block. A floating gate coupling effect is an influence on previously programmed wordlines as a result of programming a current wordline. This vulnerability is known to be present in conventional NAND flash, and may be present in other solid-state storage element embodiments as well. In some cases, the vulnerability does not manifest itself in bit errors until after the erase block has been through several thousand P/E cycles.

The increasing number of errors toward the end of an erase block results from reduced program disturbance (e.g., floating gate coupling effect) experienced by the last pages programmed in the erase block. Since the pages of an erase block are programmed sequentially, from 0 to 255, lower numbered pages may experience program disturbances from the subsequent programming of the higher numbered pages. Higher numbered pages do not experience as many program disturbances because they may have fewer or no pages programmed after them. The increased program disturbance for lower numbered pages may provide a "cushion" of extra charge in the floating gates of the cells of these pages. The leakage that can cause retention errors remains unchanged, but the extra charge due to the cushion results in the threshold voltages in the cells remaining above a read bias or read threshold. Consequently, no read error is triggered for the cell having the cushion of extra charge added to its threshold voltage (retention errors due to leakage of charge out of the floating gate decrease).

Figure 13:
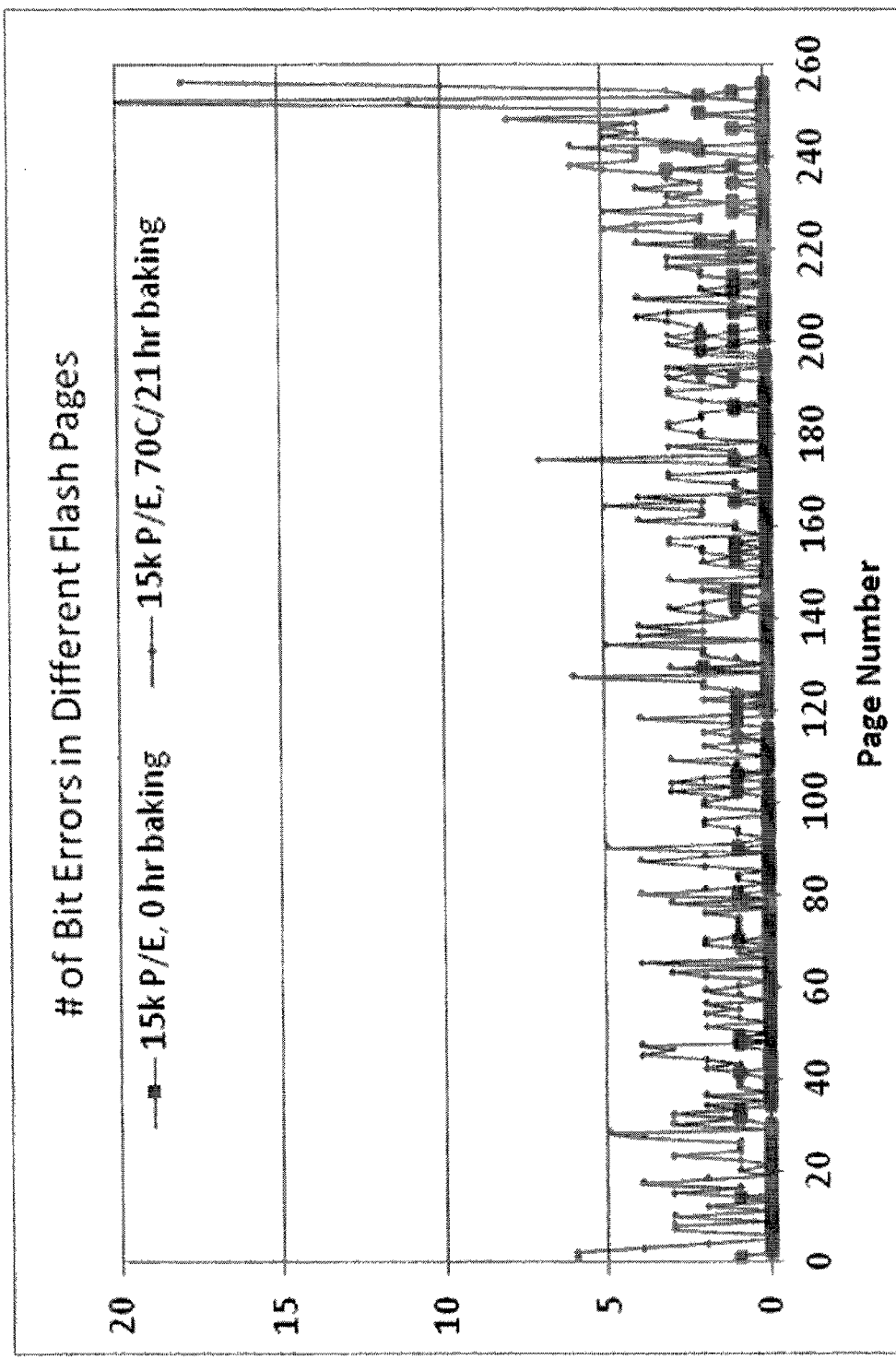
FIG. 13 is a chart illustrating bit errors per page in an erase block of a solid-state storage element resulting from another set of conditions in accordance with the present invention.

This behavior may accelerate as more trapping sites are generated as the number of P/E cycles experienced by the erase block increases. Since the Vt level of cells of the higher numbered pages is still above the read bias, even with these accumulated program disturbs, immediate read back will not show dramatic increase in bit error rate. However, the higher bit error rate presents after a retention period. FIG. 13 illustrates bit error rates of different pages of an erase block before and after retention period, which illustrates that the vulnerability of the last wordline manifests itself as a retention problem.

Consider the following example based on the erase block illustrated in FIG. 10. As was described above, pages of erase block 1002 are programmed in order according to a page programming order such that P0 is programmed first then P1, then P2, then P3, and so on. Accordingly, P0 is programmed first. As the other pages of WL0 are programmed, a floating gate coupling effect slightly increases the threshold voltages of the cells of P0 due to their physical proximity and relationship to the cells of the other pages of WL0. Similarly, the threshold voltages of the cells of P0 may increase slightly due to the programming of the pages of WL1 (namely, P2, P8, P3, and P9).

In a similar manner, the threshold voltages of the cells of P2 may increase due to the floating gate coupling effect resulting from the programming of the other pages of WL1 and the pages of WL2. Other pages of erase block 1002 are similarly affected by floating gate coupling effect from adjacent pages. This effect may be generalized by saying that the programming of pages of one wordline of erase block 1002 increases threshold voltages of previously programmed pages of adjacent wordlines of erase block 1002. For example, programming pages of WL2 may change threshold voltages of pages of WL1. However, pages of the last word line programmed in erase block 1002 are not similarly affected.

For example, if all of the pages of the erase block 1002 are programmed, the pages associated with WL63 will not experience the same amount of floating gate coupling effect as other pages in erase block 1002. P250, for example, may be affected by the programming of P252 and P253 on WL62

(since these occur after the programming of P250 dues to the page programming order) and the programming of P251, P254, and P255 on WL63 (which also occur after the programming of P250), but will not be affected by programming of pages on a word line above WL63 since WL63 is the last word line in erase block 1002. Accordingly, the pages associated with WL63 may have lower threshold voltages, and therefore lower retention times, compared to other pages of erase block 1002.

This problem is not limited to WL63. For example, if only the pages associated with WL0-WL60 are programmed and the pages associated with WL61-WL63 are intentionally left unused and are not later programmed before the erase block is intentionally erased, the pages associated with WL60 will have lower threshold voltages, and therefore lower retention times, compared to pages associated with WL0-WL59 since the pages of WL60 are the last pages programmed.

The vulnerability of the pages of the last programmed word line may be addressed using one or more of the methods described below and systems and apparatus described herein.

Improved Wordline Data Retention

Figure 14:
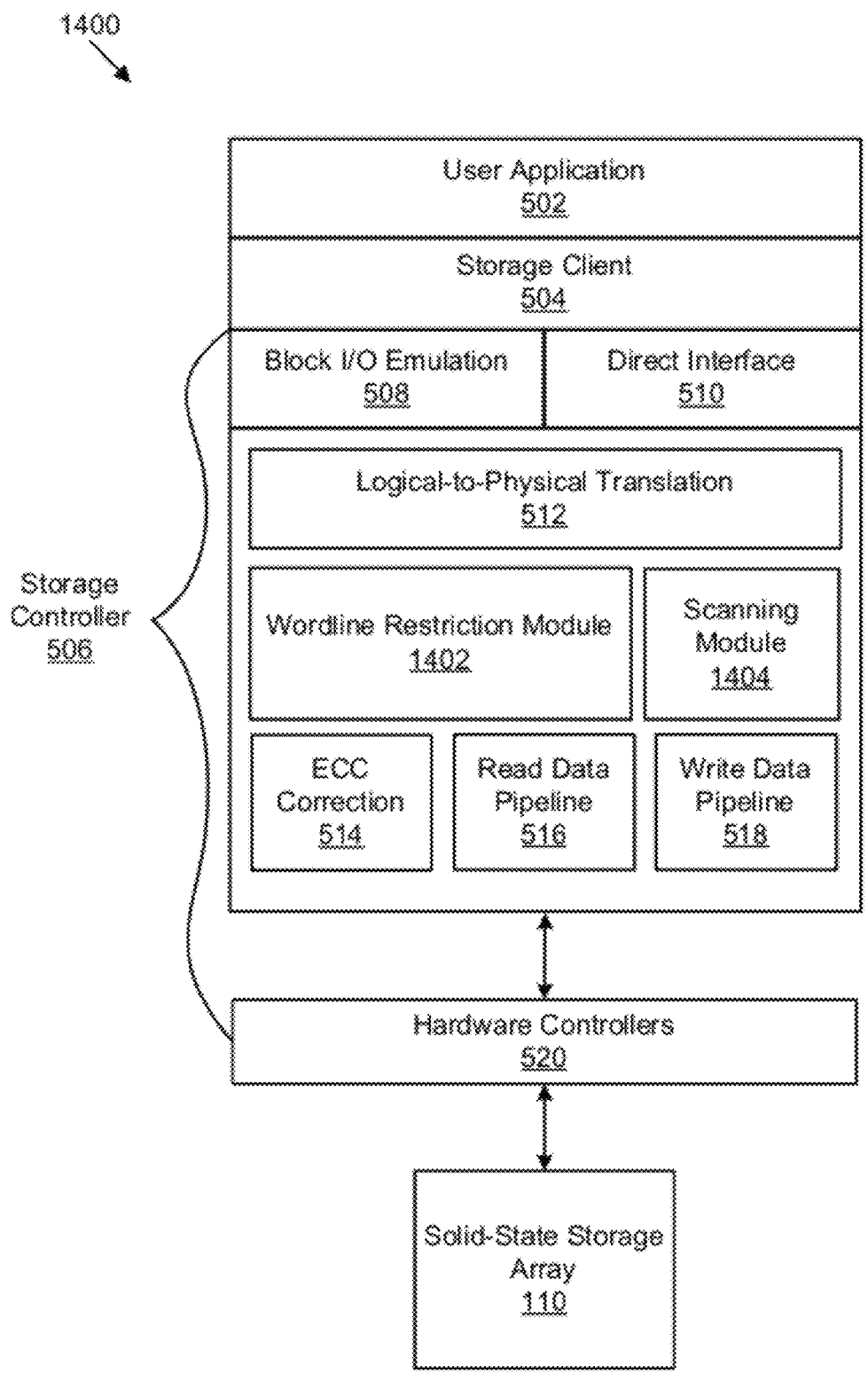
FIG. 14 is a schematic block diagram illustrating one embodiment of a logical representation of a solid-state storage controller for improved data reliability and data retention in non-volatile storage media in accordance with the present invention.

FIG. 14 is a schematic block diagram illustrating one embodiment of a logical representation of a solid-state storage controller for improved data reliability and data retention in non-volatile storage media. The user application 502, the storage client 504, and the solid-state storage array 110 may be substantially similar to the like numbered elements in FIG. 5. Furthermore, the block I/O emulation layer 508, direct interface 510, the logical-to-physical translation layer 512, the ECC correction module 514, the read data pipeline 516, the write data pipeline 518, and the hardware controllers 520 may also be substantially similar to the like numbered elements in FIG. 5. However, in the depicted embodiment, the storage controller 506 includes a wordline restriction module 1402.

Wordline restriction module 1402 identifies pages associated with selected wordlines and restricts programming of user data into the identified pages to mitigate the effects of the wordline bit errors due to endurance wear and/or retention error vulnerabilities for a wordline caused by how the wordline is used in the erase block. Wordline restriction module 1402 may belong to a portion of storage controller 506 implemented as a software driver on computer 112 and/or a portion of storage controller 506 implemented as firmware or logic on a hardware board implementing read data pipeline 516 and write data pipeline 518.

The wordline restriction module 1402 may select pages associated with any of the wordlines of an erase block for restriction. Alternatively, or in addition, the wordline restriction module 1402 may select pages associated with more than one wordline for restriction. The following examples describe ways that the wordline restriction module 1402 may select a wordline (and some or all of its associated pages) for restriction.

If all of the wordlines of an erase block are being utilized to store user data, wordline restriction module 1402 may restrict pages associated with the highest numbered (according to page programming order) wordline of the erase block (e.g., WL63 of FIG. 10). As was discussed above in relation to FIG. 10, the highest numbered wordline is associated with the last pages of a page programming order (e.g., P254, P255) and is vulnerable to retention bit errors due to its underexposure to program disturb phenomenon as was discussed above.

Note that at least one of the pages associated with the highest numbered word line (e.g., P254, P255) occurs subsequent in the page programming order to pages associated with other wordlines of the erase block. In fact, at least one page (e.g., P255) occurs subsequent in the page programming order to all other pages of the erase block 1002. Also, note that the highest numbered wordline (e.g., WL63) is physically adjacent to at least one other wordline in which user data is programmed (e.g., WL62).

If only a subset of the wordlines (e.g., WL0-WL50) of an erase block are programmed with user data and the other word lines of the erase block are intentionally unused, wordline restriction module 1402 may restrict the highest numbered wordline of the erase block within the subset (e.g., WL50) since it may be vulnerable to bit errors due to its underexposure to program disturb phenomenon because the next highest numbered word line (which is outside of the subset) is not in use and therefore will not be programmed. At least one of the pages associated with the highest numbered wordline within the subset occurs subsequent in the page programming order to pages associated with other wordlines of the subset. In fact, at least one page occurs subsequent in the page programming order to all other pages of the subset.

Alternatively, wordline restriction module 1402 may select one or more of the pages associated with a wordline that is just outside of the subset (e.g., WL51) for restriction since that wordline may be capable of being addressed and programmed and may be associated with pages that come later on in the sequence of pages as per the page programming order than some or all of the pages of the subset. In some cases, the pages associated with this word line might not be programmed with user data. Unlike the case described above in which all word lines of an erase block are in use, in this case the wordline just outside of the subset may be used to protect the highest numbered word line within the subset from bit errors due to under exposure to program disturb phenomena.

In another example, wordline restriction module 1402 may restrict one or more pages associated with wordlines in which user data was previously programmed that, for whatever reason, will not be programmed with user data in the future. Such wordlines may have poor bit error performance, poor health (excessive wear, high raw bit error rates (RBER)), or may otherwise be defective or unsuitable for storing user data. In one embodiment, a scanning module 1404 of storage controller 506 routinely (e.g., periodically) evaluates the status of all or a sampling of the pages, word lines, and/or erase blocks of the solid-state storage element looking for wordlines (or their associated pages) exhibiting unhealthy behaviors such as high raw bit error rates, low retention times, difficulty in programming, or other undesirable characteristics. Scanning module 1404 may record information about such wordlines (and their associated pages) and may restrict such wordlines via wordline restriction module 1402 so that user data is not stored by pages associated with such wordlines.

In summary, wordline restriction module 1402 may select at least one wordline associated with pages previously programmed with user data using, for example, the methods described above, and may restrict further programming of user data in the pages associated with the selected wordline. Said another way, wordline restriction module 1402 may select at least one wordline associated with pages addressable for user data, and may restrict subsequent programming of user data in the pages associated with the selected wordline. Wordline restriction module 1402 may use one or more of the following methods to restrict programming of user data in the pages associated with the selected wordlines.

According to one method of restriction, wordline restriction module 1402 facilitates programming of dummy data, such as a predetermined bit pattern, in one or more of the pages of the restricted word line during subsequent P/E cycles of the erase block instead of user data. The dummy data differs from user data in that user data is supplied to storage controller 506 (e.g., by user application 502) and dummy data is created by storage controller 506 without input from a user or user application. As a result, the capacity of the erase block for user data is decreased. However, restricting the wordline in this manner improves retention capability of the other non-restricted wordlines of the erase block significantly by providing program disturb events due to the programming of the dummy data that affect at least the pages of the wordline adjacent to the restricted wordline.

In one embodiment, the dummy data stored in the cells of the restricted wordline may have an MSB of 0 (a logical 1) "01" for MLC cells operating in SMLC mode since this bit value may be faster to program than other bit values because it may have a lower corresponding threshold voltage than other bit values as illustrated in FIG. 8A. This approach may also be described as writing dummy data only to an upper page or pages of the restricted wordline since the least significant bit of the dummy data is not changed from its erased state in which it has a value of "1." The data pattern used for the pages may comprise all zeros or an even mixture of 1s and 0s. It should be noted that the data pattern for dummy data should not be all logical 0s because this may result in the controller not programming the page because an erased page already has all logical 0s (which are physically implemented as is in the pages).

Alternatively, dummy data may be written to both upper and lower pages of the restricted word line for example by writing 00 (logically 11) in the cells of the restricted word line. Other approaches are also possible. For example, the dummy data may be randomized so that the cells of pages for the restricted wordline are not all programmed with the same dummy data.

According to another method of restriction, wordline restriction module 1402 facilitates retiring one or more pages of the restricted wordline so that the pages are not programmed at all. As a result, the pages of the restricted wordline are not programmed with user data or dummy data. As with the first method, this method decreases the capacity of the erase block for user data. Since the pages of the restricted word line are not programmed, the restricted word line does not impose program disturb events on pages of other word lines in the erase block. However, restricting a wordline in this manner does prevent storage controller 506 from storing user data in the restricted wordline where it may experience a retention error.

According to another method of restriction, storage controller 506 programs user data only in one or more upper pages associated with the restricted wordline and does not write user data to lower pages associated with the restricted wordline according to the SMLC mode described above in relation to FIGS. 8A, 8B, and 8C (program the MSB/upper page(s) only). In this method, storage controller 506 continues to write user data to both upper and lower pages of unrestricted wordlines in MLC mode. Programming user data in SMLC mode to upper pages may prevent bit errors in the user data stored in restricted wordlines because programming in SMLC mode may be more reliable than in MLC mode as described above. Furthermore, continuing to program the restricted wordline, even though in SMLC mode, imposes program disturb events on wordlines adjacent the restricted wordline, thereby reducing bit errors that would occur in the adjacent wordlines if the restricted wordline had not been programmed.

According to another method of restriction, storage controller 506 programs user data only in one or more lower pages associated with the restricted wordline and programs dummy data in one or more upper pages associated with the restricted wordline. Doing so may provide additional program disturb events on word lines adjacent the restricted word line as compared with the method described above in which lower pages of the restricted wordline are not programmed.

Wordline restriction module 1402 may restrict wordlines when certain thresholds related to P/E cycles have been met. For example, initially none of the word lines of an erase block is restricted. However, when wordline restriction module 1402 determines that an erase block or logical erase block has experienced a predetermined threshold number of P/E cycles, wordline restriction module 1402 may select one or more wordlines for restriction using the methods described above. The erase block may then go through additional P/E cycles with the selected wordline(s) restricted. Wordline restriction module 1402 may then later determine that the erase block court logical erase block has experienced a second predetermined threshold number of P/E cycles. In response, wordline restriction module 1402 may select one or more additional word lines for restriction using the methods described above. This method may continue so that over time more and more wordlines are selected for restriction in order to prevent bit errors resulting from the wordline retention problem described above.

The predetermine threshold numbers of P/E cycles may vary depending on the vendor or technology of the solid-state storage element and may range from 3,000 cycles to 7,500 cycles.

In one embodiment, the wordline restriction module 1402 receives data from the upper levels of the storage controller 506 before the data reaches the write data pipeline 518. The wordline restriction module 1402 and may insert the dummy data into the proper pages of each Erase Block (EB) in a logical page and feed the resulting modified pages into the write data pipeline 518 for writing to the solid-state storage array 110. In one embodiment, the wordline restriction module 1402 tracks which pages to select for dummy data. For example, the wordline restriction module 1402 may reference vendor specific device characteristics stored in memory, such as for example a mid-programmable read-only memory ("PROM") doing one or more of the following, analyze pages of buffered data, iterate through each page, and insert dummy data into a selected page instead of user data when the wordline restriction module 1402 determines that a selected page will be stored on a last wordline. In certain embodiments, the wordline restriction module 1402 notifies the write data pipeline 518 of particular pages to insert dummy data.

Programming dummy data in some pages of an erase block associated with the restricted wordline may be deferred to avoid stalling the data pipeline and thereby delaying programming user data to the solid-state storage element. In one embodiment, storage controller 506 may defer programming dummy data until a time when no user data is waiting to be programmed (i.e., when write data pipeline 518 is empty or partially empty). In some cases, storage controller 506 may proceed with programming a different erase block and then return to program the dummy data in the original erase block.

What is claimed is:

1. A non-volatile storage element programming method comprising:
    initiating programming of a full page of user data in a page programming order to pages associated with a set of wordlines of an erase block of a non-volatile, solid-state storage element;
    determining that a wordline configured to receive the full page of user data is also configured to not receive a program disturb when a subsequent page of user data is programmed according to the page programming order;
    in response to determining that the wordline is configured to not receive a program disturb when a subsequent page of user data is programmed according to the page programming order, selecting a wordline that is configured to receive a program disturb when a subsequent page of user data is programmed according to the page programming order; and
    programming the page of user data to the selected wordline.

2. The method of claim 1 wherein at least one of the pages associated with the selected wordline occurs subsequent to pages associated with the other wordlines of the set.

3. The method of claim 1 wherein the selected wordline is adjacent to at least one other wordline of the set.

4. The method of claim 1 further comprising programming at least one page of the determined wordline with dummy data comprising data changed from an erase state.

5. The method of claim 4 wherein the dummy data is programmed only in one or more upper page associated with the selected wordline.

6. The method of claim 4 wherein the dummy data comprises a predetermined bit pattern.

7. The method of claim 1 further comprising not programming pages associated with the selected wordline.

8. The method of claim 1 wherein programming comprises programming user data only in an upper page associated with the selected wordline.

9. The method of claim 8 further comprising not programming a lower page associated with the selected wordline.

10. The method of claim 1 wherein programming comprises programming user data only in a lower page associated with the selected wordline and programming dummy data in an upper page associated with the selected wordline.

11. The method of claim 1 further comprising restricting the selected wordline based on a number of programming/erase (P/E) cycles experienced by the erase block satisfying a threshold.

12. The method of claim 1 further comprising restricting the selected wordline based on a number of P/E cycles experienced by a logical erase block comprising the erase block satisfying a threshold.

13. The method of claim 12 further comprising restricting further programming of user data in pages associated with a second selected wordline of the set, the second selected wordline adjacent to the selected wordline, in response to determining that the number of P/E cycles experienced by the logical erase block satisfies a second threshold.

14. The method of claim 1 wherein pages associated with the selected wordline are programmed last in a page programming order.

15. The method of claim 1 wherein the erase block comprises additional unprogrammed wordlines associated with pages occurring subsequent in a page programming order for the erase block to the pages associated with the selected wordline.

16. A storage apparatus comprising:
    a write data pipeline configured to program a full page of user data in a page programming order to pages associated with wordlines of an erase block of a non-volatile, solid-state storage element; and
    a wordline restriction module configured to:
        select at least one of the wordlines of the erase block; and
        restrict programming of user data to one or more pages associated with the selected wordline by programming a predetermined bit pattern to the one or more pages associated with the selected wordline, the predetermined bit pattern comprising dummy data, wherein the dummy data varies across the selected wordline.

17. The storage apparatus of claim 16 wherein at least one of the pages associated with the selected wordline occurs subsequent to the pages associated with other wordlines in the page programming order for the erase block.

18. The storage apparatus of claim 16 wherein restricting comprises programming dummy data in one of the pages associated with the selected wordline.

19. A non-volatile storage system comprising:
    a non-volatile, solid-state storage element containing an erase block with a plurality of pages associated with a plurality of wordlines; and
    a storage apparatus configured to:
        program a full page of data in a page programming order to pages associated with a set of wordlines of the erase block;
        select at least one of the wordlines of the set programmed with the user data; and
        restrict programming of data in pages associated with the selected wordline by applying a program voltage to program dummy data to one or more of the pages associated with the selected wordline thereby causing a program disturb event for one or more pages storing the user data, wherein the dummy data varies across the one or more of the pages associated with the selected wordline.

20. The system of claim 19 wherein one of the pages associated with the selected wordline occurs subsequent to pages associated with other wordlines in the page programming order for the erase block.

21. A method for storing data, comprising:
    storing a full page of data in a page programming order to pages associated with multiple wordlines of an erase block of a non-volatile storage element;
    selecting a wordline of the multiple wordlines;
    controlling the data stored in the selected wordline such that at least one page of the selected wordline that is addressable to store user data is not programmed with user data; and
    programming the at least one page of the selected wordline with dummy data that varies across the at least one page of the selected wordline to cause a program disturb event for one or more pages of a wordline storing user data.

22. The method of claim 21, further comprising controlling data from being stored in another wordline of the multiple wordlines.

23. The method of claim 21, further comprising programming the data in a logical page programming order.

* * * * *